(12) United States Patent
Huang et al.

(10) Patent No.: US 7,553,737 B2
(45) Date of Patent: Jun. 30, 2009

(54) METHOD FOR FABRICATING RECESSED-GATE MOS TRANSISTOR DEVICE

(75) Inventors: Ming-Yuan Huang, Yun-Lin Hsien (TW); Jar-Ming Ho, Taipei (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 135 days.

(21) Appl. No.: 11/673,597

(22) Filed: Feb. 12, 2007

(65) Prior Publication Data

US 2008/0032476 A1 Feb. 7, 2008

(30) Foreign Application Priority Data

Jun. 8, 2006 (TW) .............................. 95120372 A

(51) Int. Cl.
*H01L 21/20* (2006.01)
(52) U.S. Cl. ................. 438/386; 257/E21.653
(58) Field of Classification Search ............... 438/386
See application file for complete search history.

(56) References Cited

U.S. PATENT DOCUMENTS

| | | | | | |
|---|---|---|---|---|---|
| 4,713,678 | A | * | 12/1987 | Womack et al. ............. | 257/302 |
| 5,177,576 | A | * | 1/1993 | Kimura et al. ............... | 257/71 |
| 5,519,236 | A | * | 5/1996 | Ozaki ......................... | 257/302 |
| 5,525,531 | A | * | 6/1996 | Bronner et al. ............. | 438/152 |
| 5,550,396 | A | * | 8/1996 | Tsutsumi .................... | 257/330 |
| 5,654,214 | A | * | 8/1997 | Frijlink et al. .............. | 438/172 |
| 5,670,803 | A | * | 9/1997 | Beilstein et al. ............ | 257/278 |
| 5,831,301 | A | * | 11/1998 | Horak et al. ................ | 257/302 |
| 5,880,004 | A | * | 3/1999 | Ho ............................. | 438/421 |
| 5,945,707 | A | * | 8/1999 | Bronner et al. ............. | 257/330 |
| 6,005,272 | A | * | 12/1999 | Gardner et al. ............. | 257/344 |
| 6,063,657 | A | * | 5/2000 | Bronner et al. ............. | 438/244 |
| 6,066,527 | A | * | 5/2000 | Kudelka et al. ............. | 438/243 |
| 6,091,094 | A | * | 7/2000 | Rupp .......................... | 257/296 |
| 6,103,619 | A | * | 8/2000 | Lai ............................. | 438/638 |
| 6,294,423 | B1 | * | 9/2001 | Malik et al. ................. | 438/241 |
| 6,297,089 | B1 | * | 10/2001 | Coronel et al. ............. | 438/246 |
| 6,339,241 | B1 | * | 1/2002 | Mandelman et al. ........ | 257/301 |
| 6,355,538 | B1 | * | 3/2002 | Tseng ......................... | 438/424 |
| 6,426,252 | B1 | * | 7/2002 | Radens et al. .............. | 438/243 |
| 6,437,388 | B1 | * | 8/2002 | Radens et al. .............. | 257/301 |
| 6,440,794 | B1 | * | 8/2002 | Kim ............................ | 438/248 |
| 6,452,224 | B1 | * | 9/2002 | Mandelman et al. ........ | 257/296 |
| 6,459,123 | B1 | * | 10/2002 | Enders et al. ............... | 257/331 |

(Continued)

FOREIGN PATENT DOCUMENTS

TW 200503179 1/2005

(Continued)

*Primary Examiner*—Fernando L Toledo
*Assistant Examiner*—Ankush k Singal
(74) *Attorney, Agent, or Firm*—Winston Hsu

(57) ABSTRACT

A method of fabricating gate trench utilizing pad pullback technology is disclosed. A semiconductor substrate having thereon a pad oxide layer and pad layer is provided. Trench capacitors are formed in a memory array region of the semiconductor substrate. Each of the trench capacitors has a trench top oxide (TTO) that extrudes from a main surface of the semiconductor substrate. The pad layer is recessed from its top and covered with a polysilicon layer. Isolation trenches are formed in the substrate and then filled with photoresist. The TTO is then stripped. The pad layer that is not covered by the photoresist is pulled back to define the gate trench.

10 Claims, 24 Drawing Sheets

U.S. PATENT DOCUMENTS

| | | | |
|---|---|---|---|
| 6,541,810 B2 * | 4/2003 | Divakaruni et al. | 257/302 |
| 6,551,915 B2 * | 4/2003 | Lin et al. | 438/598 |
| 6,573,137 B1 * | 6/2003 | Divakaruni et al. | 438/248 |
| 6,576,945 B2 * | 6/2003 | Mandelman et al. | 257/301 |
| 6,586,795 B2 * | 7/2003 | Goebel et al. | 257/302 |
| 6,693,041 B2 * | 2/2004 | Divakaruni et al. | 438/702 |
| 6,720,602 B2 * | 4/2004 | Clevenger et al. | 257/302 |
| 6,734,066 B2 * | 5/2004 | Lin et al. | 438/259 |
| 6,777,737 B2 * | 8/2004 | Mandelman et al. | 257/305 |
| 6,794,242 B1 * | 9/2004 | Dyer et al. | 438/244 |
| 6,809,368 B2 * | 10/2004 | Divakaruni et al. | 257/302 |
| 6,815,749 B1 * | 11/2004 | Mandelman et al. | 257/301 |
| 6,828,615 B2 * | 12/2004 | Lee et al. | 257/301 |
| 6,872,629 B2 * | 3/2005 | Hsiao et al. | 438/386 |
| 6,943,092 B2 * | 9/2005 | Kim | 438/424 |
| 6,964,898 B1 * | 11/2005 | Cheng | 438/243 |
| 6,977,405 B2 * | 12/2005 | Lutzen et al. | 257/301 |
| 7,015,145 B2 * | 3/2006 | Jaiprakash et al. | 438/700 |
| 7,034,352 B2 * | 4/2006 | Seitz et al. | 257/301 |
| 7,153,737 B2 * | 12/2006 | Kwon et al. | 438/243 |
| 7,321,147 B2 * | 1/2008 | Okajima | 257/301 |
| 7,342,274 B2 * | 3/2008 | Huang | 257/302 |
| 2002/0076880 A1 * | 6/2002 | Yamada et al. | 438/243 |
| 2003/0072198 A1 * | 4/2003 | Goldbach et al. | 365/200 |
| 2003/0082876 A1 * | 5/2003 | Mandelman et al. | 438/243 |
| 2004/0029343 A1 * | 2/2004 | Seidl et al. | 438/243 |
| 2004/0129942 A1 * | 7/2004 | Divakaruni et al. | 257/68 |
| 2004/0195608 A1 | 10/2004 | Kim | |
| 2004/0203208 A1 * | 10/2004 | Mandelman et al. | 438/259 |
| 2005/0064710 A1 * | 3/2005 | Chidambarrao et al. | 438/689 |
| 2005/0106820 A1 | 5/2005 | Tran | |
| 2005/0151206 A1 | 7/2005 | Schwerin | |
| 2005/0164446 A1 * | 7/2005 | Lin et al. | 438/243 |
| 2005/0173748 A1 * | 8/2005 | Seitz et al. | 257/301 |
| 2005/0191807 A1 * | 9/2005 | Yang | 438/248 |
| 2005/0230734 A1 | 10/2005 | Ha | |
| 2006/0003536 A1 * | 1/2006 | Kudelka | 438/386 |
| 2006/0003560 A1 * | 1/2006 | Regul et al. | 438/520 |
| 2006/0091442 A1 * | 5/2006 | Adkisson et al. | 257/301 |
| 2006/0220089 A1 * | 10/2006 | Chung et al. | 257/301 |
| 2006/0270144 A1 * | 11/2006 | Huang | 438/238 |
| 2007/0032032 A1 * | 2/2007 | Heineck et al. | 438/386 |
| 2007/0032033 A1 * | 2/2007 | Heineck et al. | 438/386 |
| 2007/0224757 A1 * | 9/2007 | Cheng et al. | 438/243 |
| 2007/0232019 A1 * | 10/2007 | Cho | 438/424 |
| 2007/0235801 A1 * | 10/2007 | Cheng et al. | 257/330 |
| 2008/0057638 A1 * | 3/2008 | Jang | 438/218 |
| 2008/0164519 A1 * | 7/2008 | Herrick et al. | 257/331 |

FOREIGN PATENT DOCUMENTS

TW    200520220    6/2005

* cited by examiner

METHOD FOR FABRICATING RECESSED-GATE MOS TRANSISTOR DEVICE

BACKGROUND OF THE INVENTION

1. Field of the Invention

The present invention relates generally to a method for fabricating semiconductor devices. More specifically, the present invention relates to a method for making recessed-gate Metal-Oxide-Semiconductor (MOS) transistor device of a trench type Dynamic Random Access Memory (DRAM).

2. Description of the Prior Art

Integrated circuit devices are continually being made smaller in order to increase speed, make the device more portable and to reduce the cost of manufacturing the device. However, certain designs have a minimum feature size, which cannot be reduced without compromising the integrity of electrical isolation between devices and consistent operation of the device. For example, dynamic random access memory devices (DRAMs), which use vertical metal oxide semiconductor field effect transistors (MOSFETs) with deep trench (DT) storage capacitors, have a minimum features size of approximately 0.1 μm~0.15 μm. Below that size, the internal electric fields exceed the upper limit for storage node leakage, which decreases retention time below an acceptable level. Therefore, there is a need for different methods and/or different structures to further reduce the size of integrated circuit devices.

With the continued reduction in device size, sub-micron scale MOS transistors have to overcome many technical challenges. As the MOS transistors become narrower, that is, their channel length decreases, problems such as junction leakage, source/drain breakdown voltage, and data retention time become more pronounced.

One solution to decrease the physical dimension of ULSI circuits is to form recessed-gate or "trench-type" transistors, which have a gate electrode buried in a groove formed in a semiconductor substrate. This type of transistor reduces short channel effects by effectively lengthening the effective channel length by having the gate extend into the semiconductor substrate.

The recessed-gate MOS transistor has a gate insulation layer formed on sidewalls and bottom surface of a recess etched into a substrate, a conductive filling the recess, contrary to a planar gate type transistor having a gate electrode formed on a planar surface of a substrate.

However, the aforesaid recessed-gate technology has some shortcomings. For example, the recess for accommodating the recessed gate of the MOS transistor is etched into a semiconductor wafer by using conventional dry etching methods. It is difficult to control the dry etching and form recesses having the same depth across the wafer. A threshold voltage control problem arises because of recess depth variation.

SUMMARY OF THE INVENTION

It is one object of this invention to provide a method of fabricating a recessed-gate trench of DRAM devices in order to solve the above-mentioned problems.

According to the claimed invention, a method for fabricating a recessed gate trench, comprising providing a semiconductor substrate with a main surface, forming a pad layer on the main surface, forming a plurality of trench capacitors in a memory array area of the semiconductor substrate, wherein every trench capacitor has a trench top layer and the trench top layer coplanar with the pad layer, removing a portion thickness of the pad layer, forming a cap layer on the semiconductor substrate, removing the cap layer to expose the trench top layer, performing a lithography process and an etching process to form a shallow trench isolation in the memory array area, filling a first photoresist layer in the shallow trench isolation, removing the pad layer uncovered by the first photoresist layer and the cap layer, and removing the first photoresist layer and the cap layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
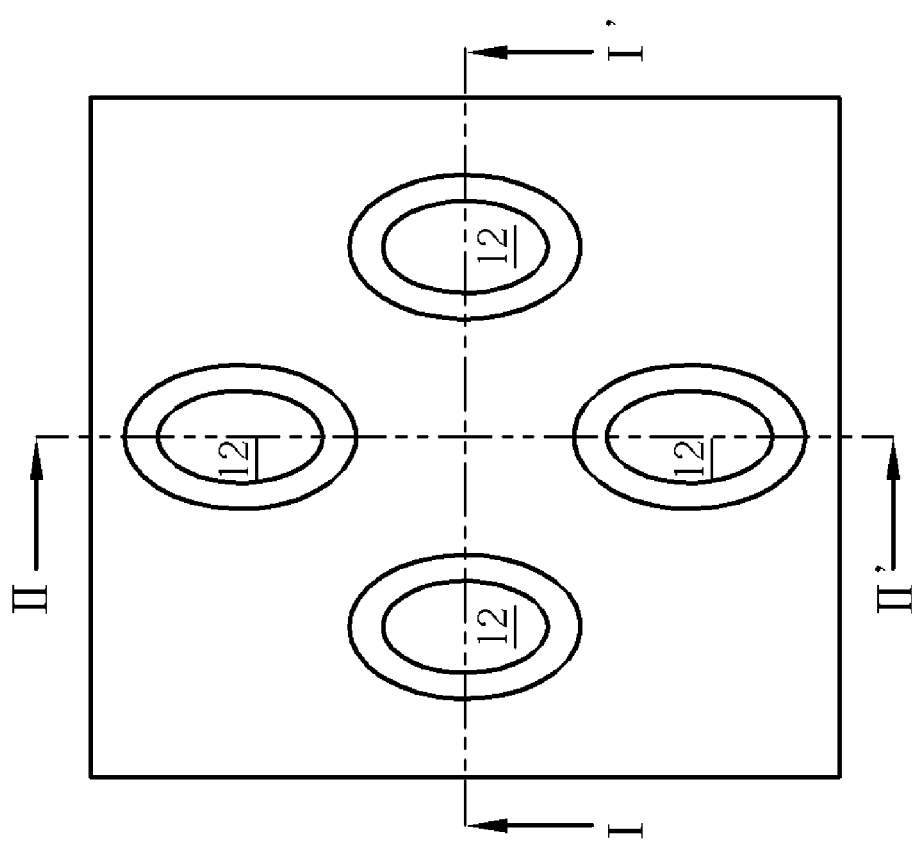
FIG. 1 is a schematic top view showing the layout of the deep trench capacitors in the memory array area according to this invention.

Please refer to FIGS. 1-13. FIG. 1 is a schematic top view showing the layout of the deep trench capacitors in the memory array area according to this invention. FIGS. 2-13 are schematic, cross-sectional diagrams illustrating an exemplary method of fabricating a recessed-gate MOS transistor in accordance with the first preferred embodiment of this invention.

Figure 2:
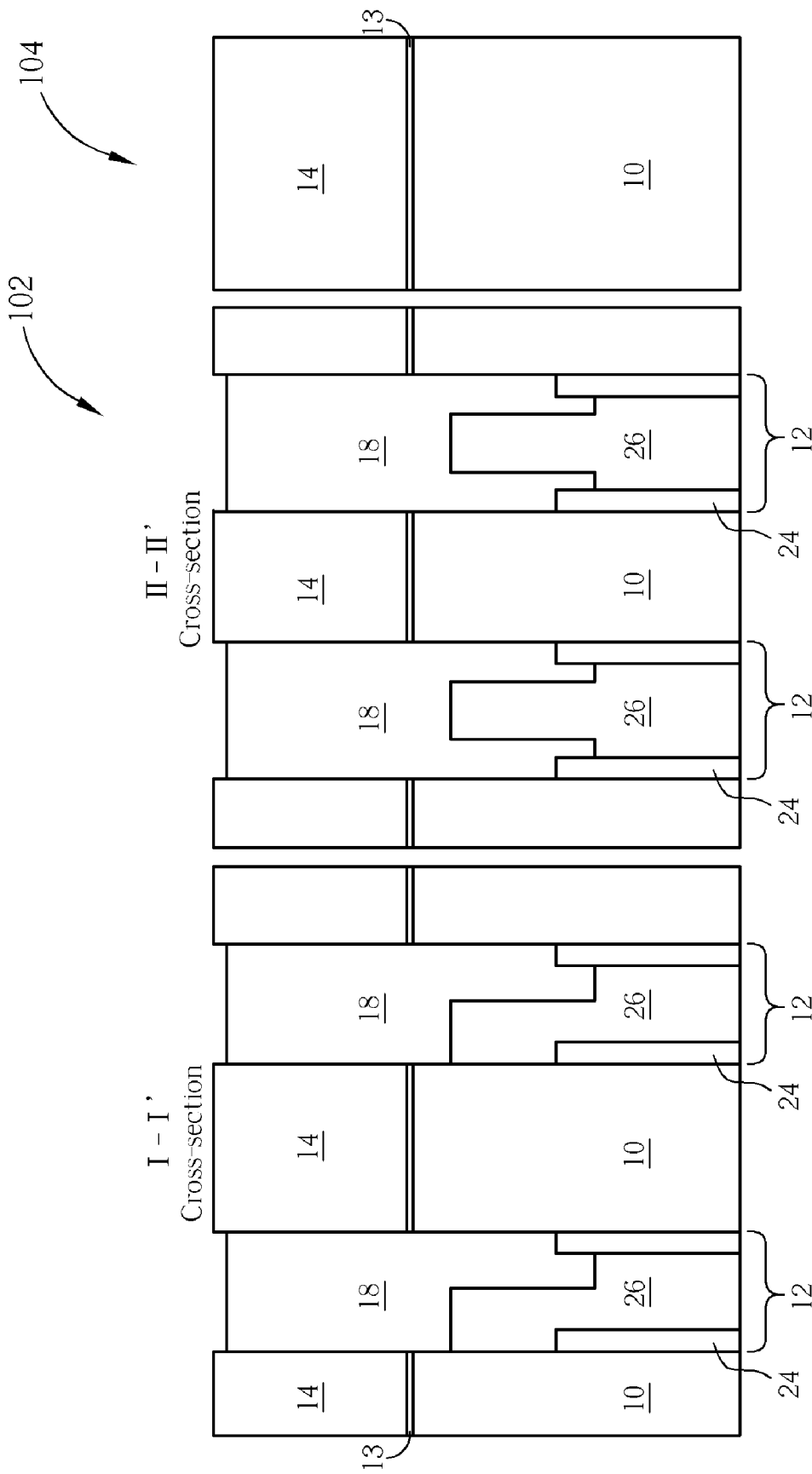
FIGS. 2-13 are schematic, cross-sectional diagrams illustrating an exemplary method of fabricating a recessed-gate MOS transistor in accordance with the first preferred embodiment of this invention, wherein FIG. 13 only shows the I-I' cross section.

As shown in FIG. 1 and FIG. 2, a semiconductor substrate 10 such as a silicon substrate, silicon epitaxital substrate or Silicon-On-Insulator (SOI) substrate is provided. A pad oxide layer 13 and a pad silicon nitride layer 14 are deposited on the semiconductor substrate 10, and a plurality of deep trench capacitors 12 are then formed in the memory array area.

Both of the I-I' cross-section and II-II' cross-section of the deep trench capacitors 12 of the memory array area 102 in FIG. 1, and the cross-section of a support circuit area 104 are shown in FIG. 2 and succeeding figures.

As shown in FIG. 2, the deep trench capacitor 12 comprises a sidewall capacitor dielectric layer 24 and a doped polysilicon 26. The deep trench capacitor 12 is fabricated using Single-Sided Buried Strap (SSBS) process. The doped polysilicon 26 functions as one electrode of the deep trench capacitor 12.

The method for fabricating the deep trench capacitor 12 is known in the art. For the sake of simplicity, only the upper portions of the deep trench capacitor 12 are shown in figures. It is understood that the deep trench capacitor 12 further comprises a buried plate acting as the other capacitor electrode, which is not shown.

The aforesaid SSBS process generally comprises the steps of etching back the sidewall oxide dielectric layer and the polysilicon (or so-called Poly-2) to a first depth; refilling the recess with another layer of polysilicon (or so-called Poly-3); etching back the Poly-3 to a second depth; forming an asymmetric spacer on the Poly-3; etching away the Poly-3 and Poly-2 that are not covered by the asymmetric spacer to a third depth.

Next, a silicon oxide layer is deposited over the semiconductor substrate 10 and fills the recesses on the deep trench capacitors 12. Thereafter, using the pad silicon nitride layer 14 as a polishing stop layer, a chemical mechanical polishing (CMP) process is carried out to planarize the silicon oxide layer, thereby forming a trench top oxide layer 18 on each deep trench capacitor 12.

Figure 3:
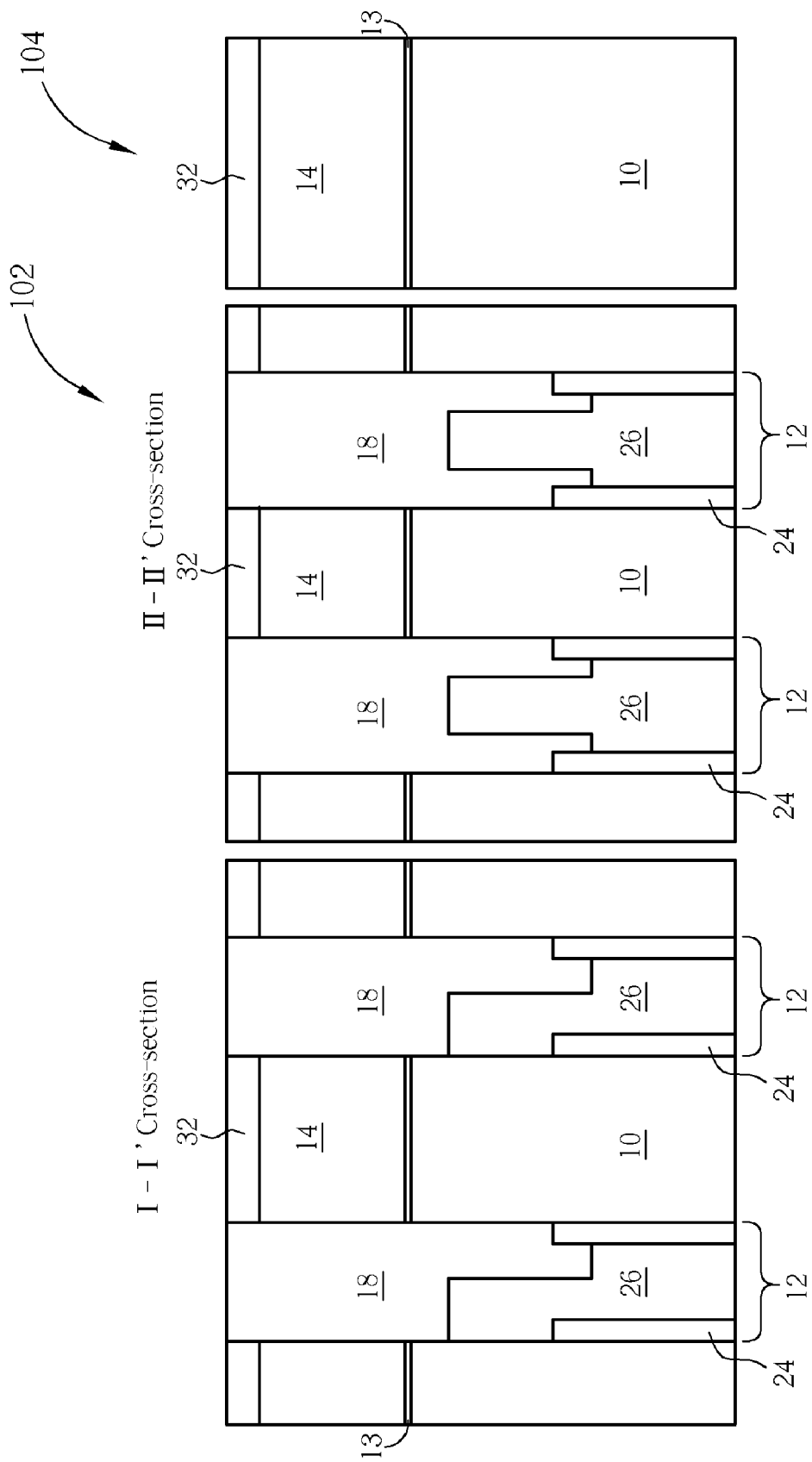

As shown in FIG. 3, a portion of thickness of the pad silicon nitride layer 14 such as about 400 angstroms is stripped off by using conventional etching methods such as wet etching involving the use of hot phosphoric acid solution to make the trench top oxide layer 18 protrude from the main surface of the pad silicon nitride layer 14.

A chemical vapor deposition (CVD) process such as a low-pressure CVD (LPCVD) or plasma-enhanced CVD (PECVD) is carried out to deposit a polysilicon layer 32 on the trench top oxide layer 18 and the pad silicon nitride layer 14. According to the preferred embodiment of this invention, the polysilicon layer 32 has thickness of about 500-1000 angstroms, preferably 600 angstroms.

Next, a CMP process is performed to polish the polysilicon layer 32 until the trench top oxide layer 18 is exposed.

Figure 4:
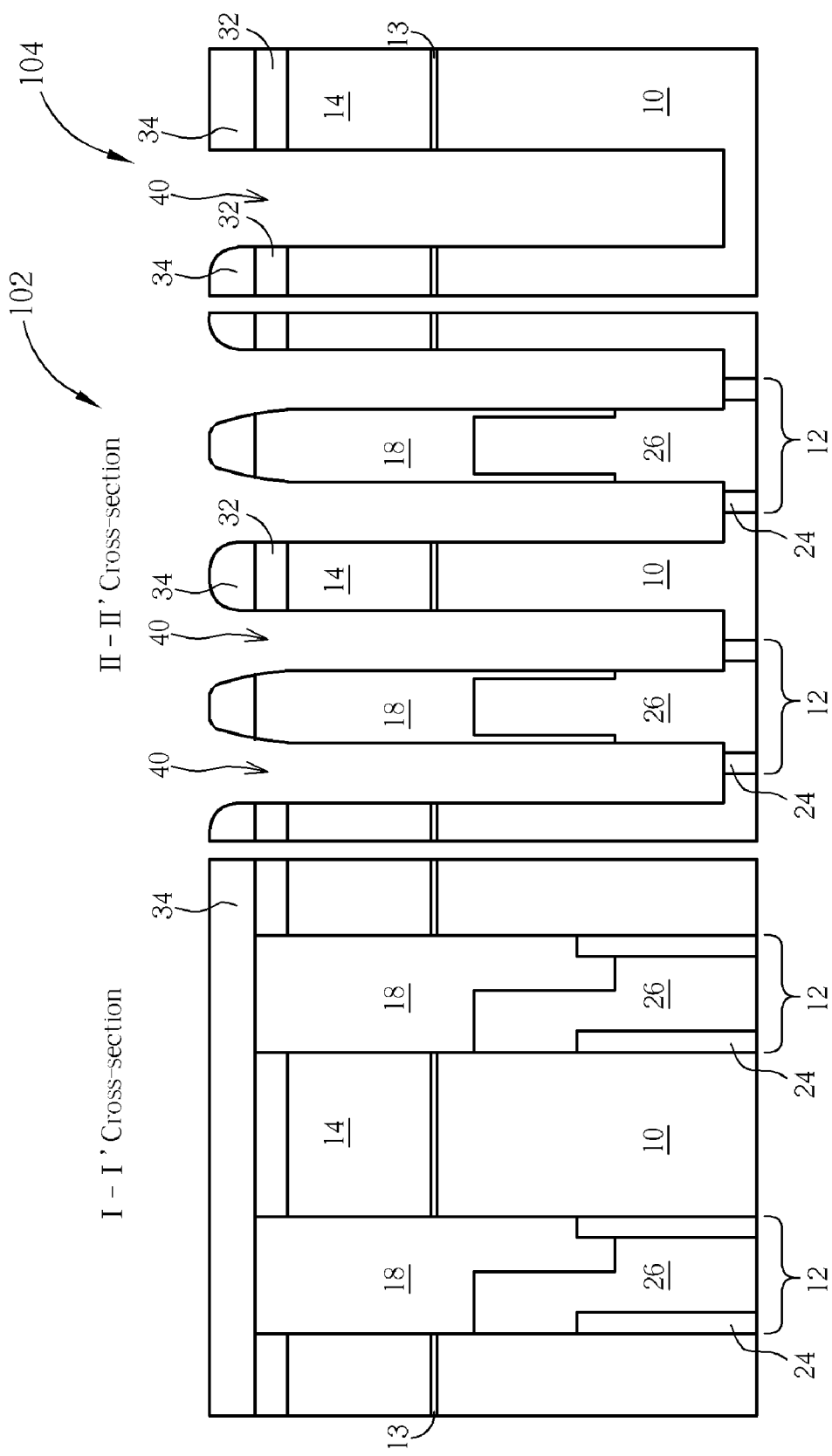

As shown in FIG. 4, a silicon oxide layer 34 such as a boron doped silicate glass (BSG) layer is deposited on the polysilicon layer 32, and then a second polysilicon layer (not shown) is deposited on the silicon oxide layer 34, and the polysilicon layer 32, the silicon oxide layer 34, and the second polysilicon layer are used as a etching hard mask.

Next, an active area is defined using a lithography process and an etching process. A photoresist layer is formed on the second polysilicon layer, and the photoresist layer has a shallow trench isolation (STI) opening pattern. The STI opening pattern of the photoresist layer is transferred to the etching hard mask by etching, and then the semiconductor substrate 10 is etched to form STI trenches 40 in the memory array area 102 and in the support circuit area 104, and the active area is defined at the same time.

Figure 5:
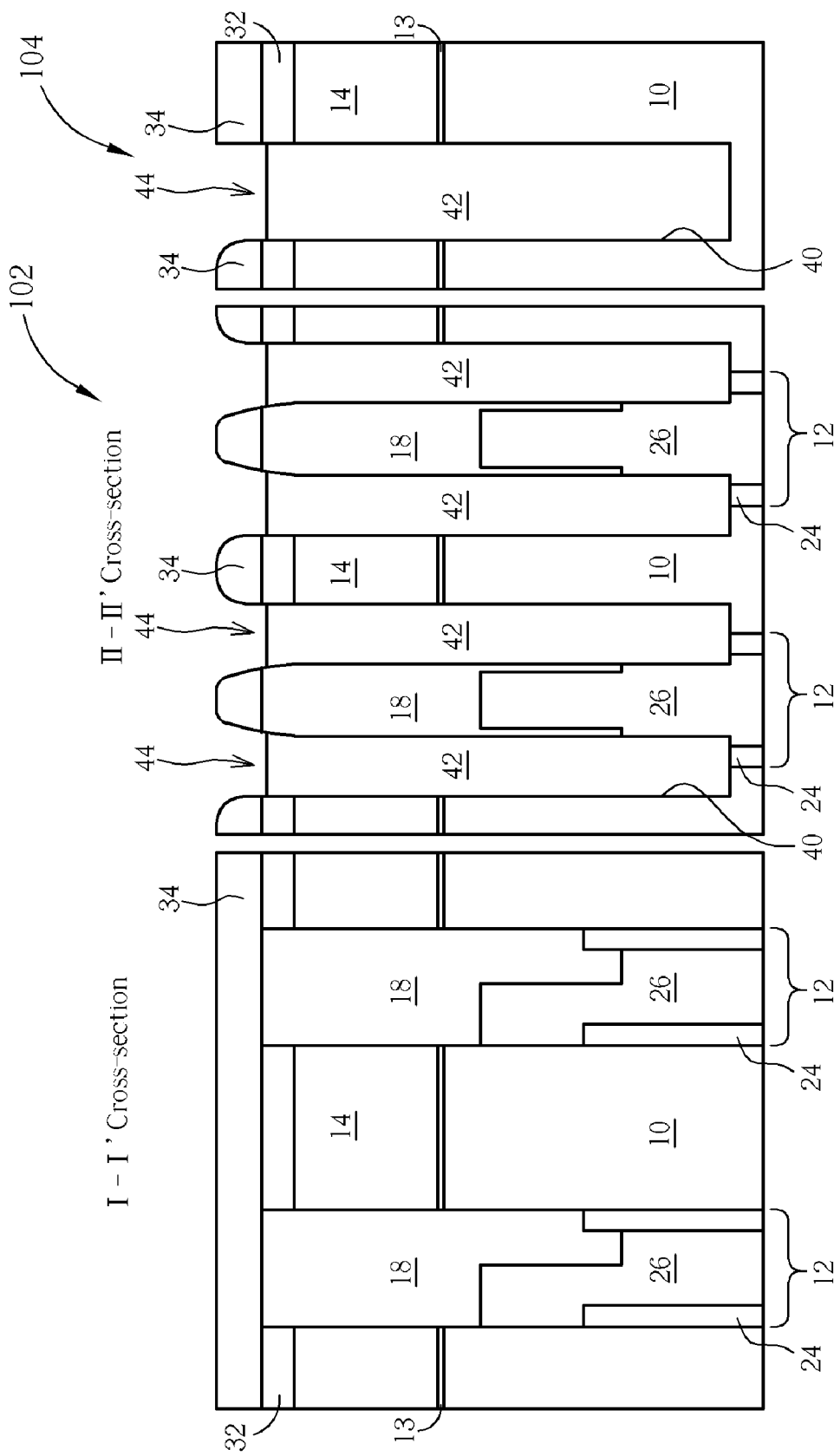

In general, after the STI trenches 40 are finished, the thickness of the remaining silicon oxide layer 34 is about 400 angstroms. As shown in FIG. 5, a photoresist layer 42 is formed on the semiconductor substrate 10 to fill the STI trenches 40. The photoresist layer 42 is then dry cured or hardened. Then, a dry etching process is performed to etch back the photoresist layer 42 to expose the silicon oxide layer 34. After the dry etching, the top surface of the photoresist layer 42 is lower than the silicon oxide layer 34 and is inside the STI trenches 40 to form a recessed area 44.

Figure 6:
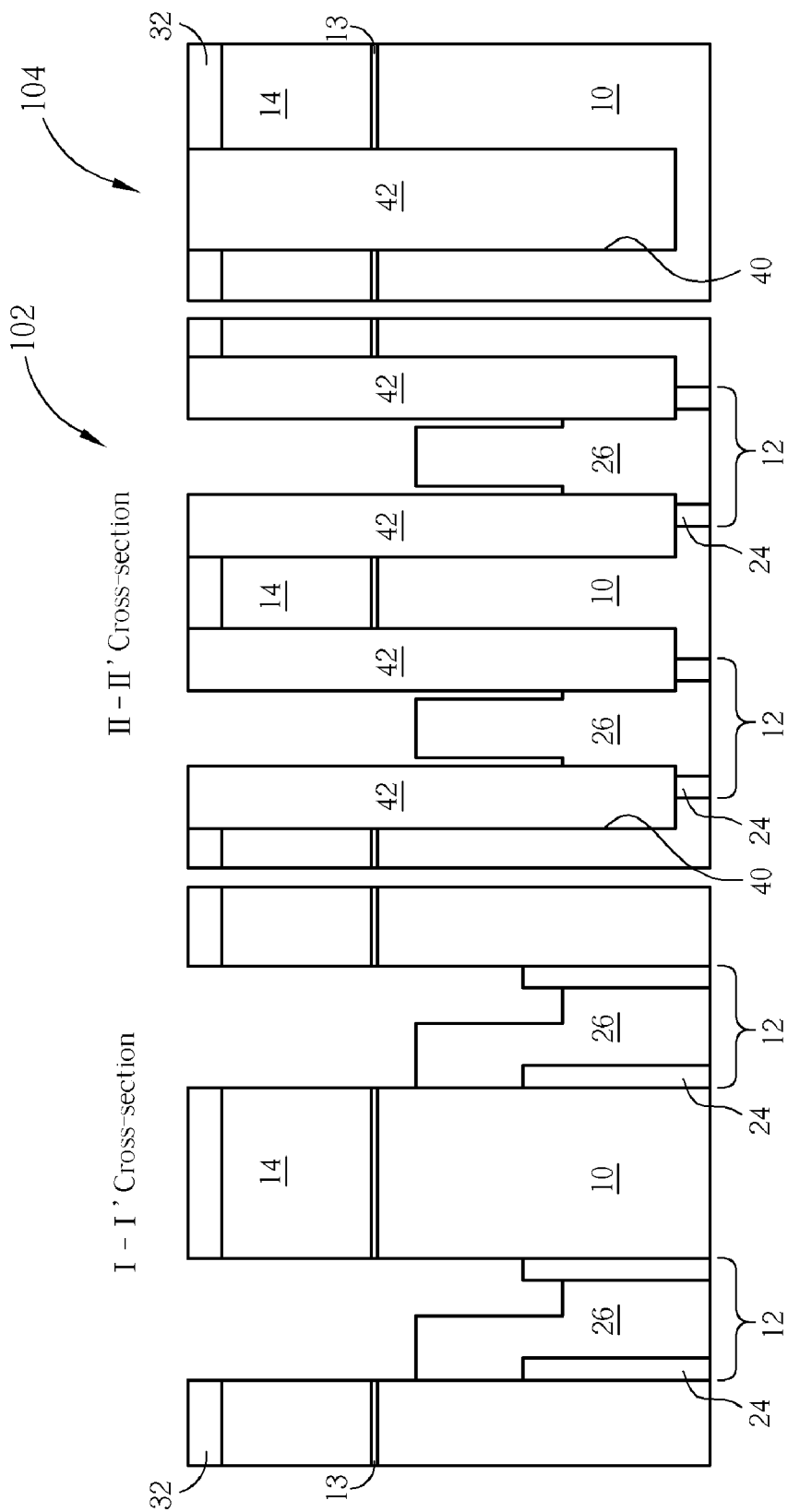

As shown in FIG. 6, an etching process such as a wet etching process is performed to remove the silicon oxide layer 34 and the trench top oxide layer 18. After removing the silicon oxide layer 34, the polysilicon layer 32 is exposed.

Figure 7:
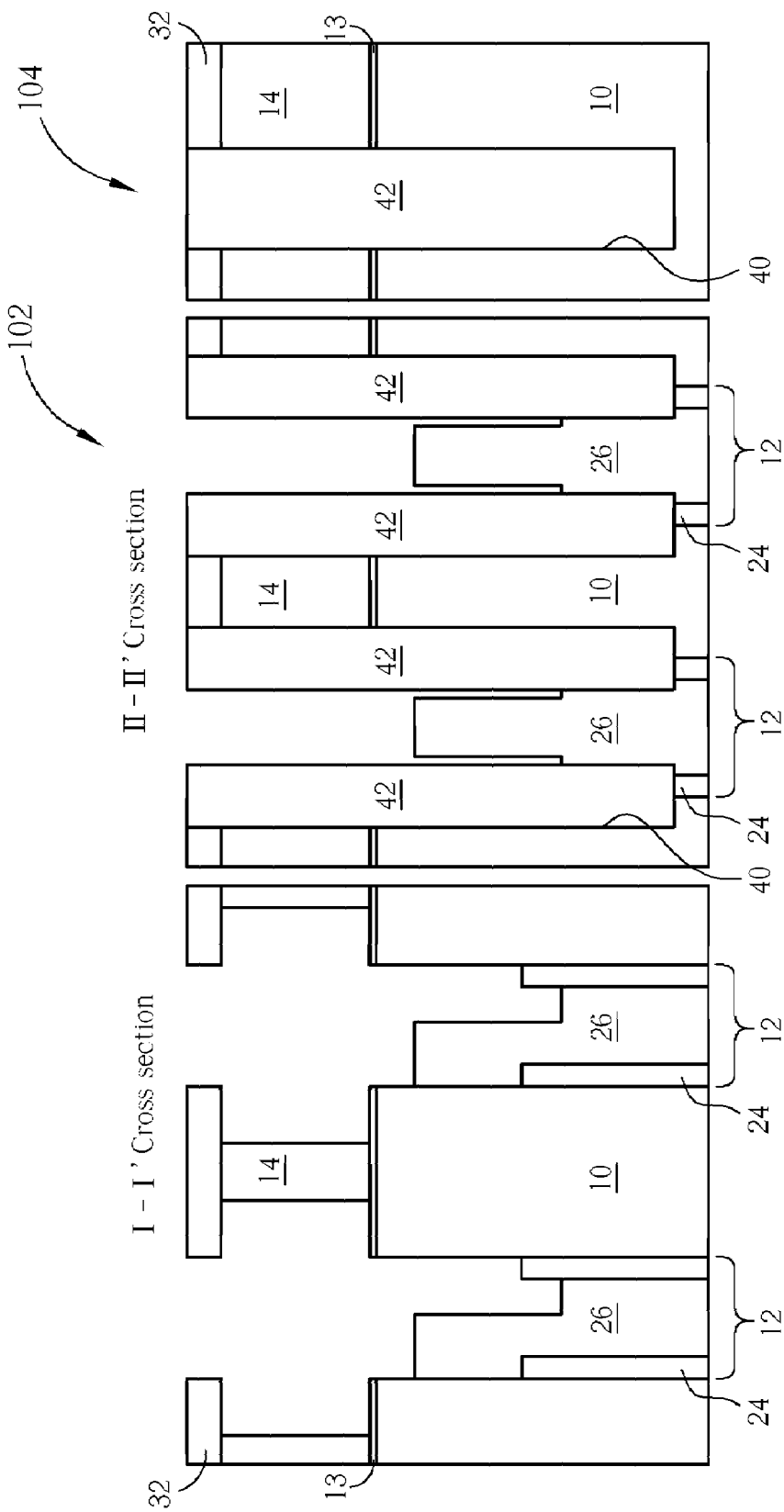

As shown in FIG. 7, a wet etching process involving the use of hot phosphoric acid solution is performed to laterally etch the pad silicon nitride layer 14 that is not covered by the photoresist layer 42. According to the preferred embodiment of the present invention, the lateral etching distance of the pad silicon nitride layer 14 is about 550 angstroms, and the pad silicon nitride layer 14 of about 450 angstroms remains. The remnant pad silicon nitride layer 14 defines the position of the gate trench.

Figure 8:
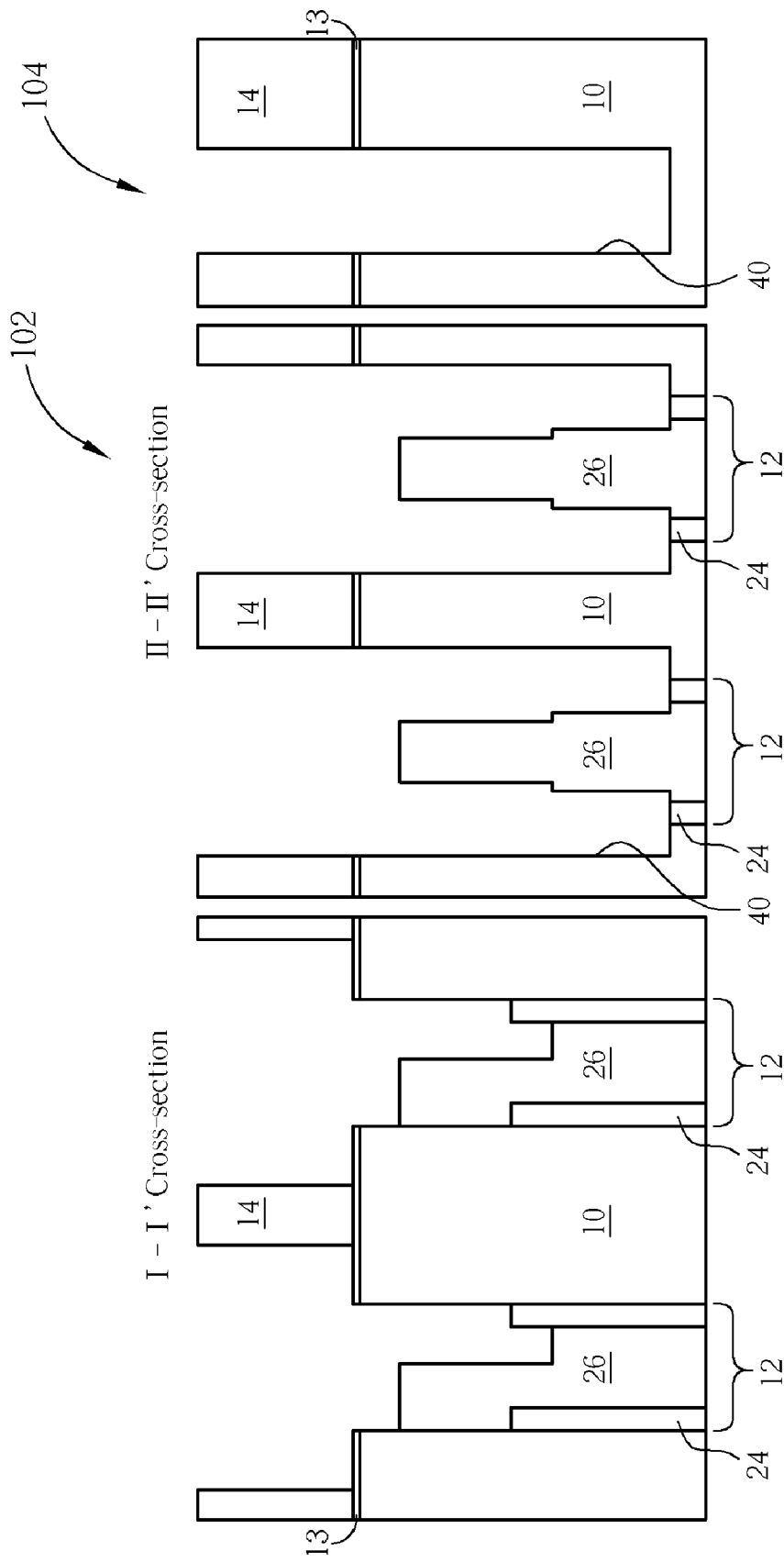

As shown in FIG. 8, the polysilicon layer 32 and the photoresist layer 42 are removed after the pad silicon nitride layer 14 is etched.

Figure 9:
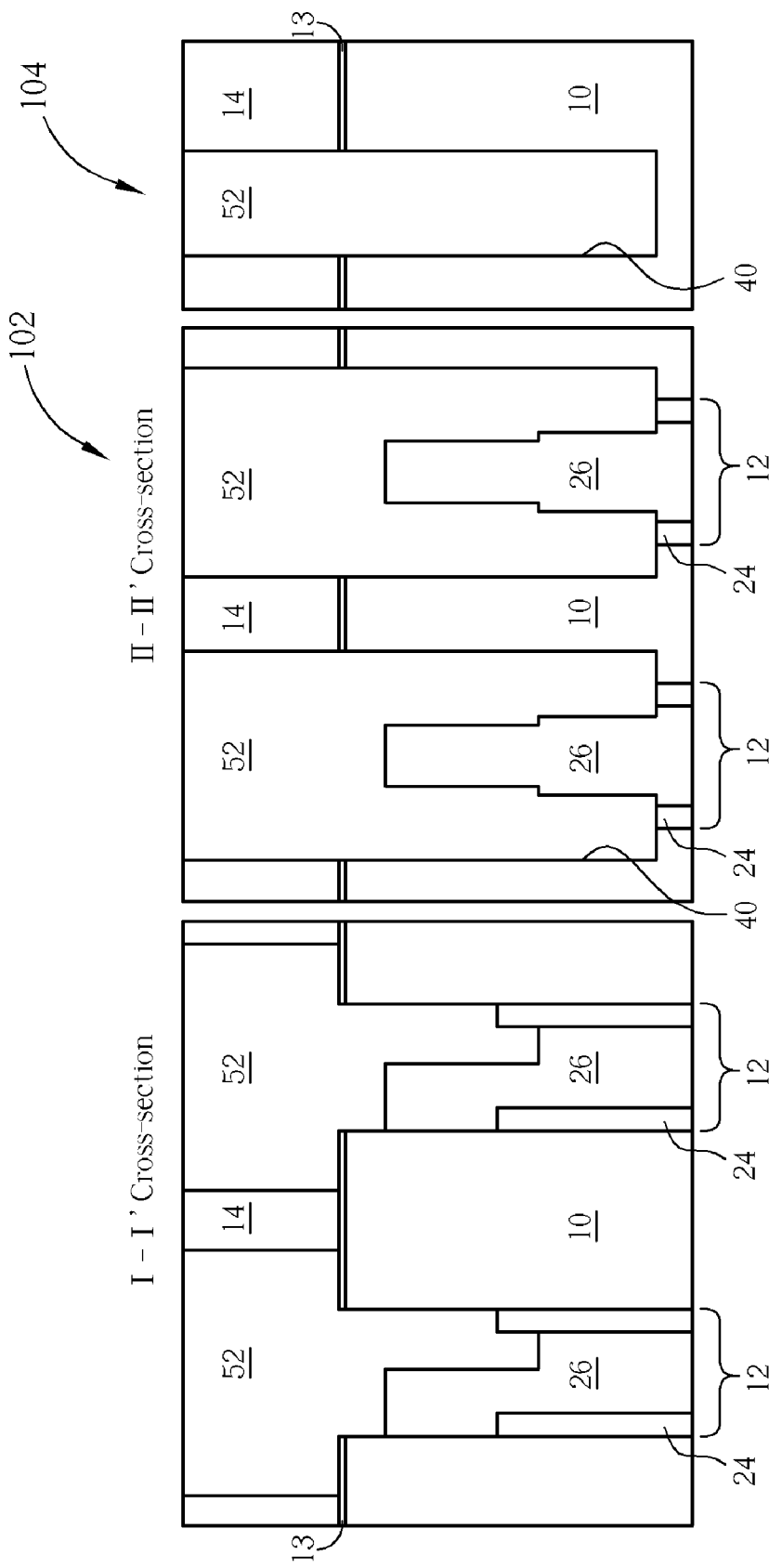

As shown in FIG. 9, a CVD process such as a LPCVD, high-density plasma CVD (HDPCVD) process, or PECVD is carried out to deposit a silicon oxide layer 52 on the semiconductor substrate 10. A CMP process is performed to polish the silicon oxide layer 52 to expose the pad silicon nitride layer 14.

Figure 10:
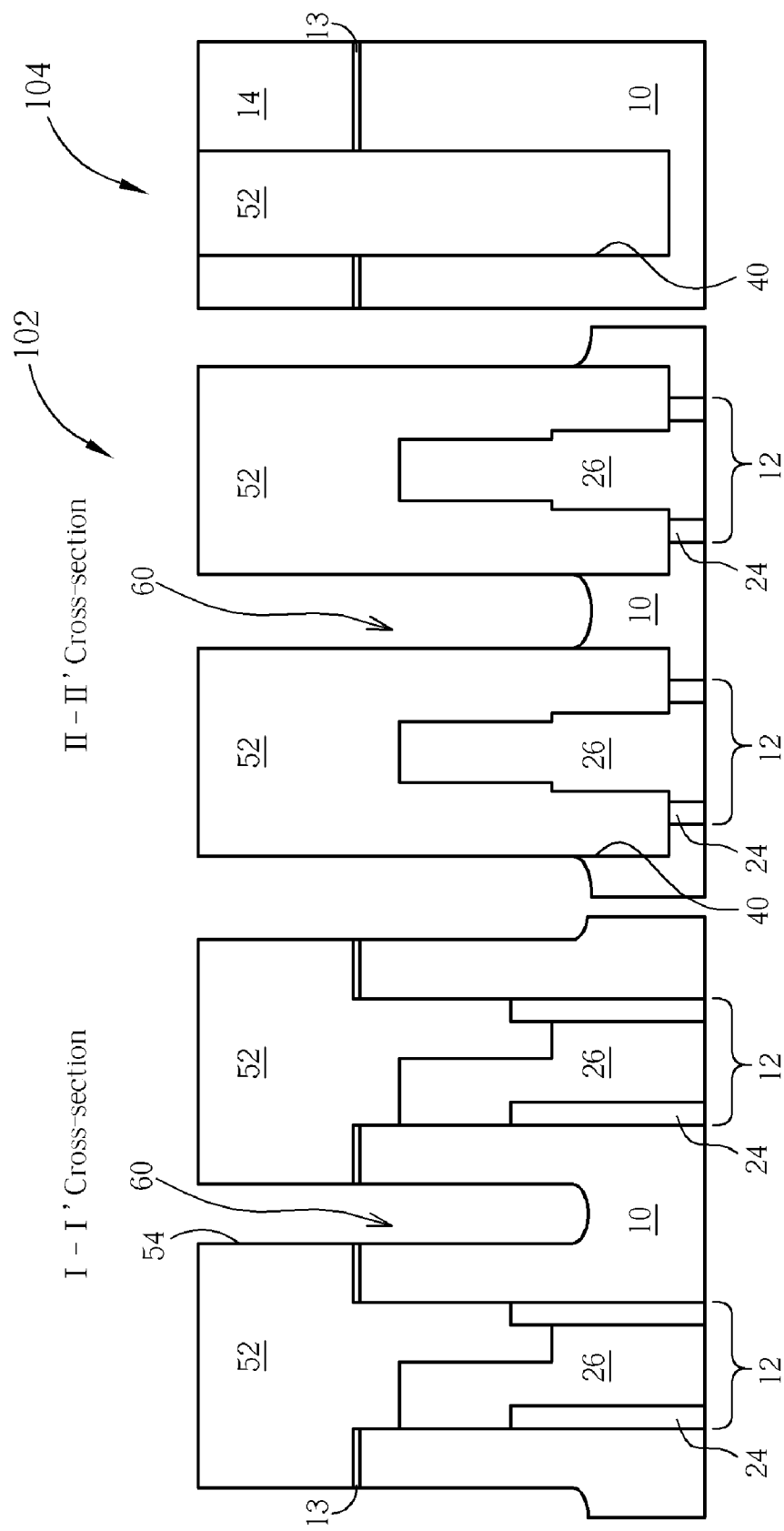

As shown in FIG. 10, an etching process is carried out to remove the pad silicon nitride layer 14 in the memory array area 102 to form an opening 54 in the silicon oxide layer 52. An anisotropic etching process is carried out, using the silicon oxide layer 52 as an etching mask, to etch the pad oxide layer 13 and the semiconductor substrate 10 to form a self-aligned gate trench 60. When removing the pad silicon nitride layer 14 in the memory array area 102, the support circuit area 104 is protected by a photoresist layer (not shown), and the photoresist layer is removed after removing the pad silicon nitride layer 14 in the memory array area 102.

Figure 11:
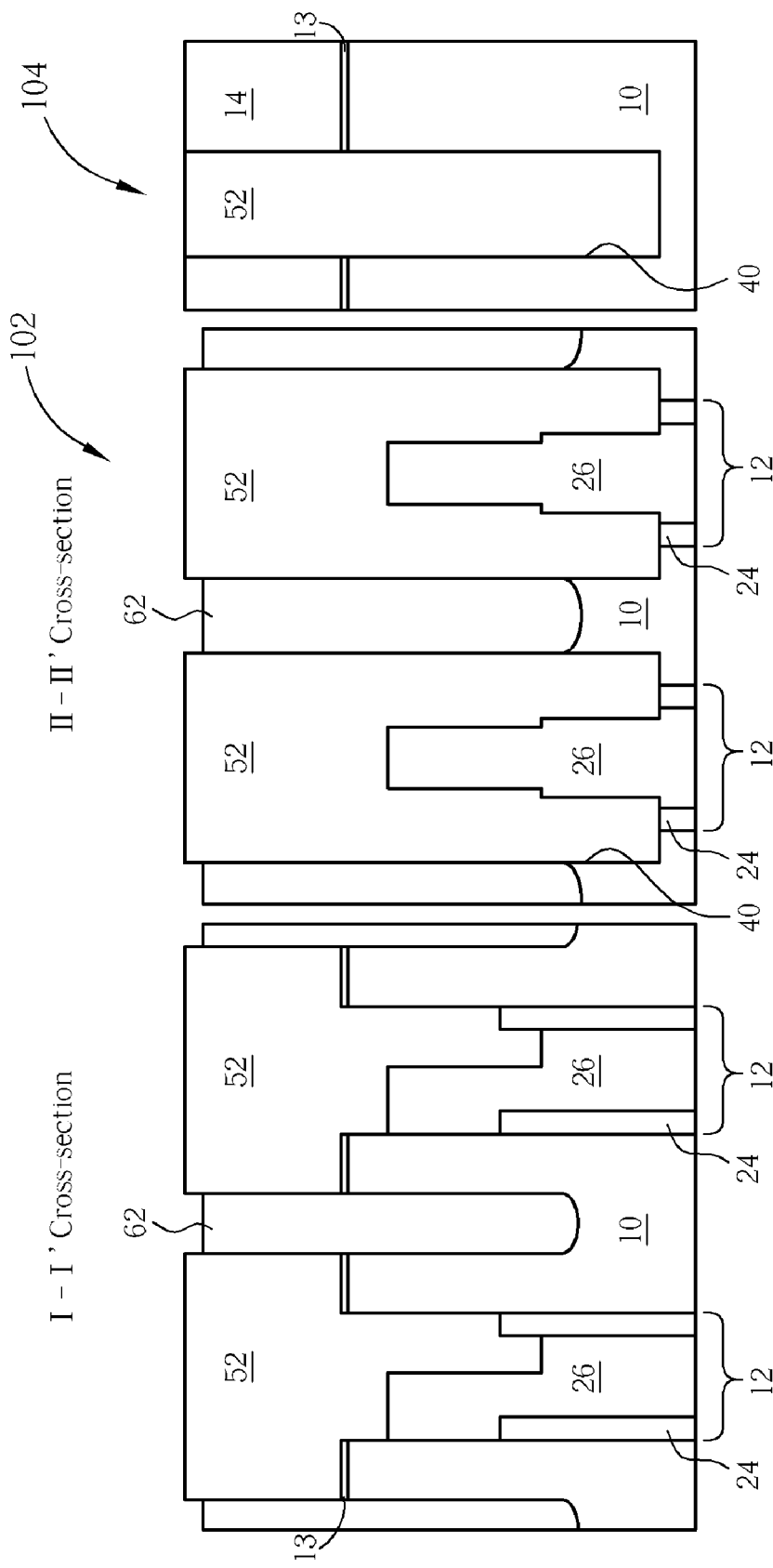

As shown in FIG. 11, a photoresist layer 62 is formed on the semiconductor substrate 10 to fill the gate trenches 40, and the photoresist layer 62 is dry cured or hardened. Then, a dry etching process is performed to etch back the photoresist layer 62 to expose the silicon oxide layer 52 and make the top surface of the photoresist layer 62 lower than the top surface of the silicon oxide layer 52.

Figure 12:
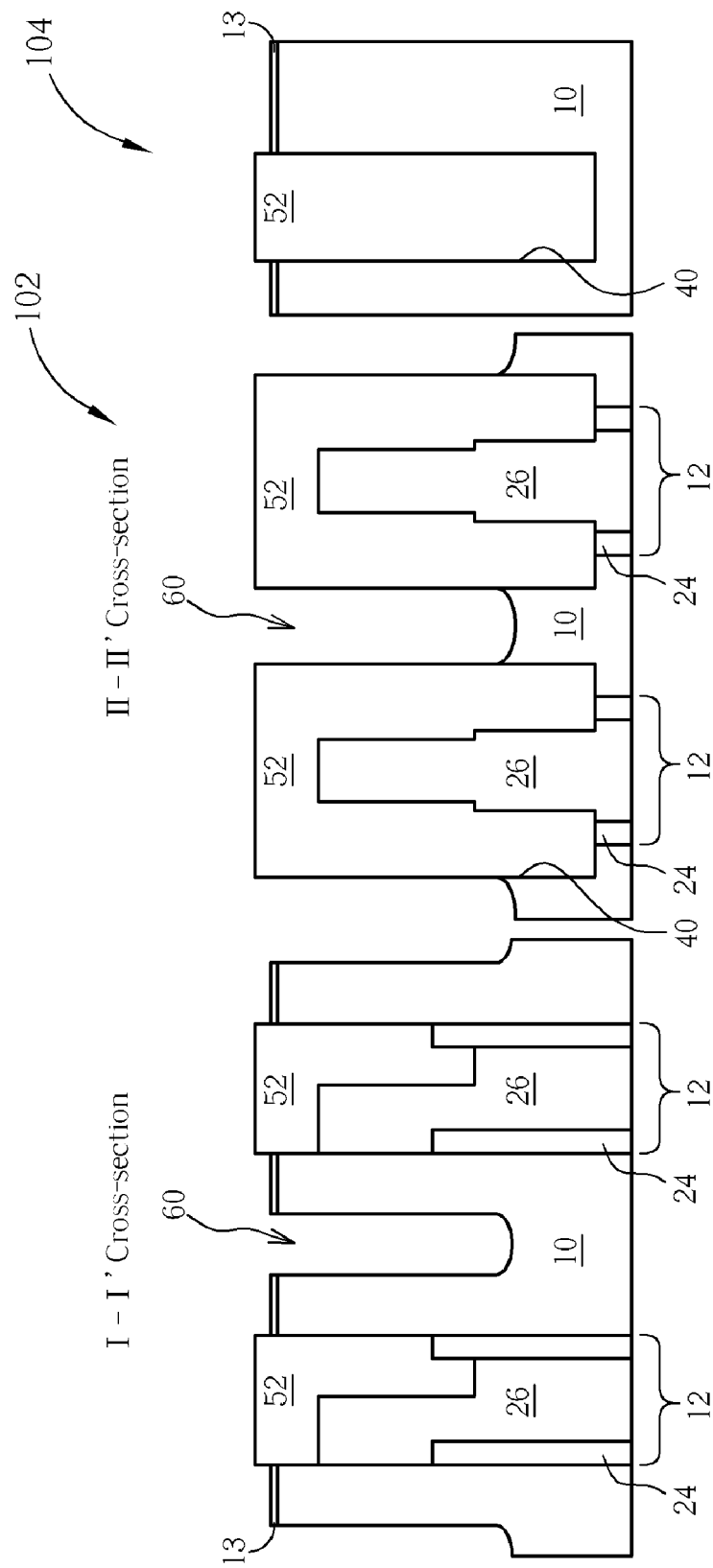

As shown in FIG. 12, an etching process such as a wet etching process or dry etching process is carried out to remove a predetermined thickness of the silicon oxide layer 52, and then another etching process such as a wet etching process is carried out to remove the pad silicon nitride layer 14 in the support circuit area 104. Then, the photoresist layer 62 is removed.

Figure 13:
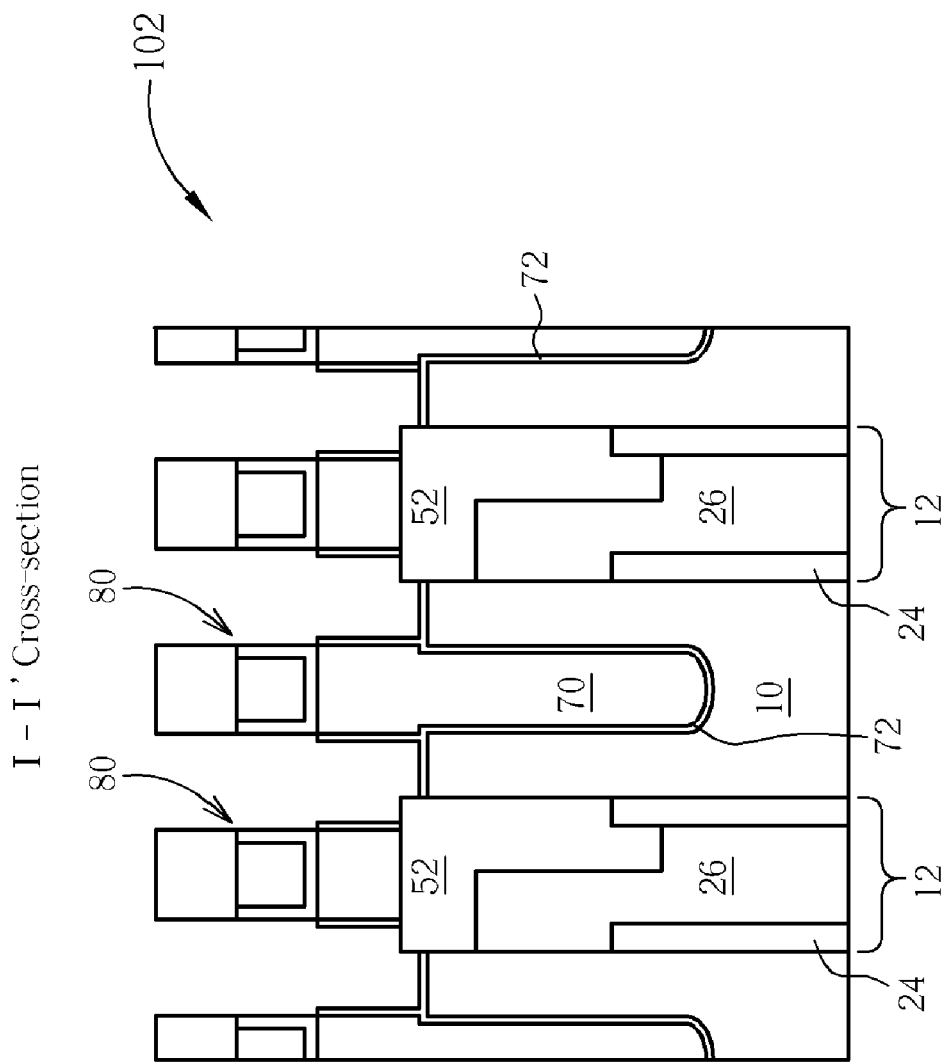

As shown in FIG. 13, a thermal oxidation process is performed to form a thick gate dielectric layer 72 on the exposed semiconductor substrate 10 and on the surface of the gate trench 60. The aforesaid thermal oxidation process may be In-Situ Steam Growth (ISSG) process, but not limited thereto. Then, a trench gate 70 and a gate conductor 80 are formed on the semiconductor substrate 10 and within the gate trench 60, wherein the trench gate 70 and the gate conductor 80 are defined at the same time.

FIGS. 14-24 are schematic, cross-sectional diagrams illustrating an exemplary method of fabricating a recessed-gate MOS transistor in accordance with the second preferred embodiment of this invention, wherein like number numerals designate similar or the same parts, regions or elements.

Figure 14:
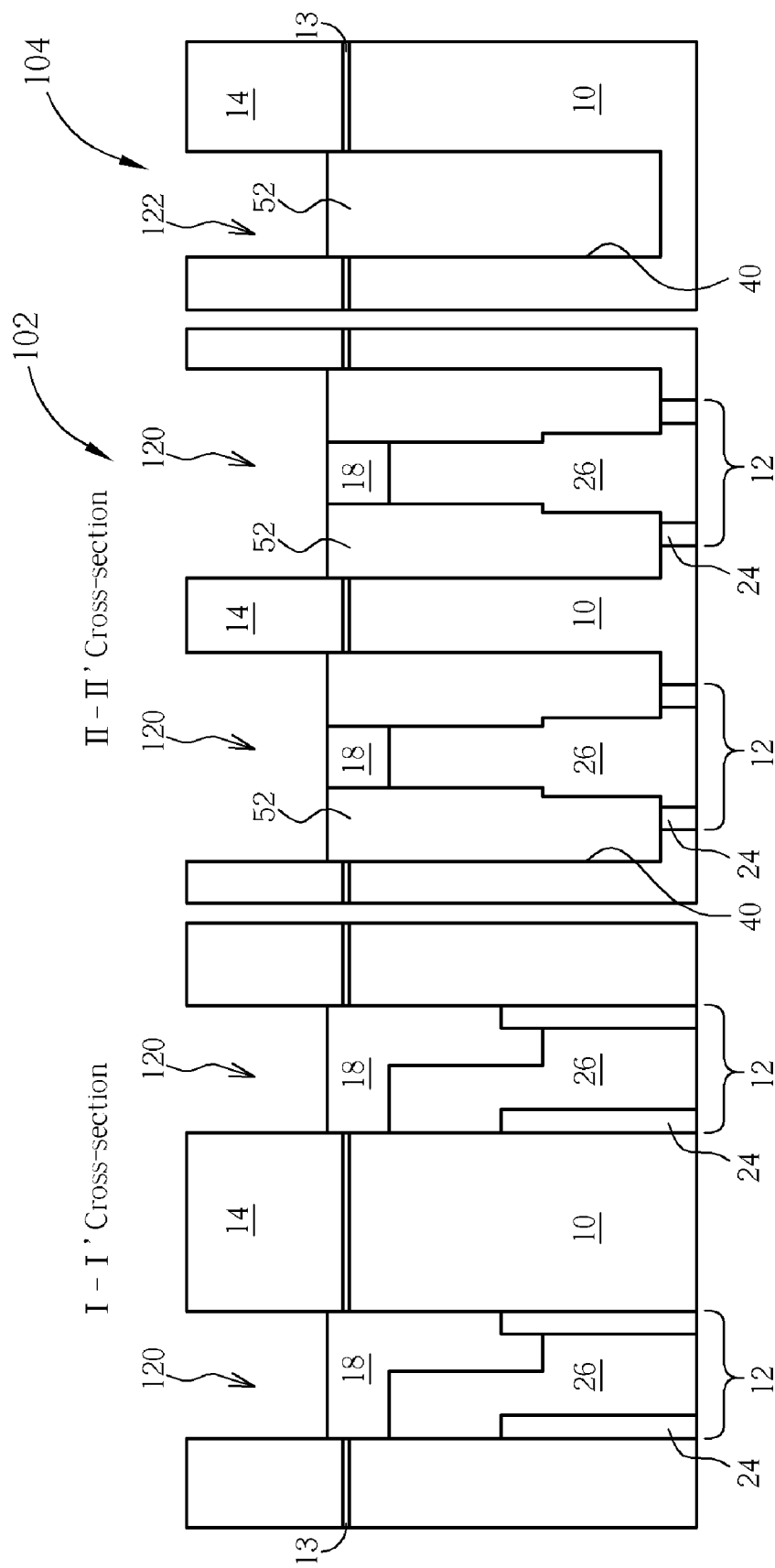
FIGS. 14-24 are schematic, cross-sectional diagrams illustrating an exemplary method of fabricating a recessed-gate MOS transistor in accordance with the second preferred embodiment of this invention, wherein FIG. 24 only shows the II-II' cross section.

As shown in FIG. 14, the deep trench capacitors 12 and the trench top oxide layer 18 are formed on the semiconductor substrate 10. After the STI process is completed, an etching process such as a wet etching process or dry etching process is carried out to remove the trench top oxide layer 18 and the silicon oxide layer 52 of a predetermined thickness to make the top surface of the trench top oxide layer 18 and the silicon oxide layer 52 coplanar with the main surface of the semiconductor substrate 10.

At this phase, recessed areas 120 are formed on the deep trench capacitors 12 and on the STI structure in the memory array area 102, and recessed areas 122 are formed on the STI area in the support circuit area 104.

Figure 15:
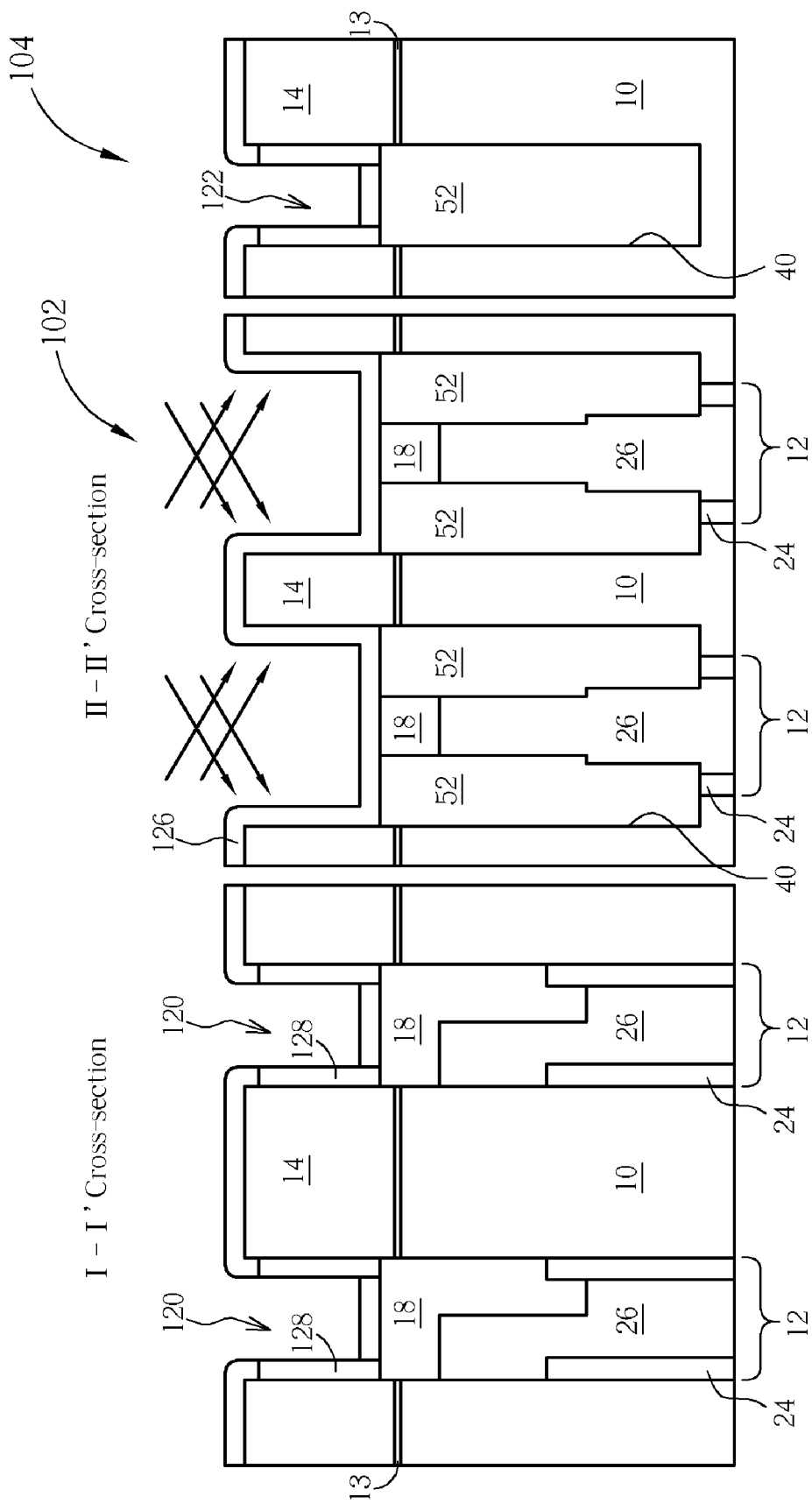

As shown in FIG. 15, an amorphous silicon layer 126 is deposited on the semiconductor substrate 10, and the thickness of the amorphous silicon layer 126 is about 100 angstroms. The amorphous silicon layer 126 conformally covers the pad silicon nitride layer 14 and the recessed areas 120 and 122. Next, two tilt-angle ion implantation processes are carried out to implant dopants such as $BF_2$ into the amorphous silicon layer 126. The aforesaid two tilt-angle ion implantation processes are carried out with opposite ion implantation directions, and therefore as shown in the I-I' cross section, a portion of the amorphous silicon layer 128 on the side walls of the pad silicon nitride layer 14 is not implanted with dopants $BF_2$.

Figure 16:
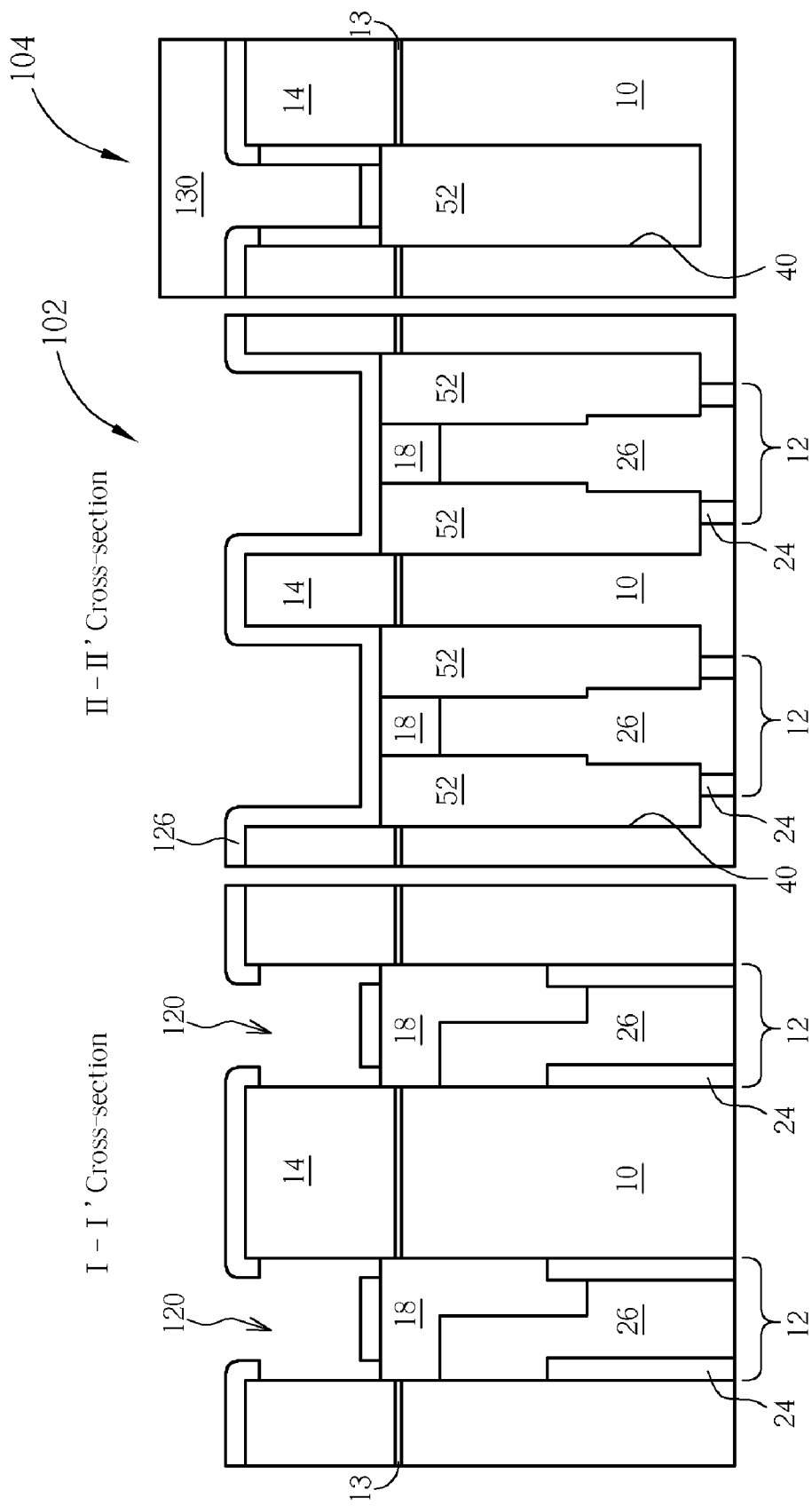

As shown in FIG. 16, the support circuit area 104 is protected using a photoresist layer 130, and a selective wet etching process such as diluted ammonia solution is used to selectively etch away the aforesaid amorphous silicon layer 128 which is not implanted with dopants $BF_2$, and a portion of the pad silicon nitride layer 14 is exposed.

Figure 17:
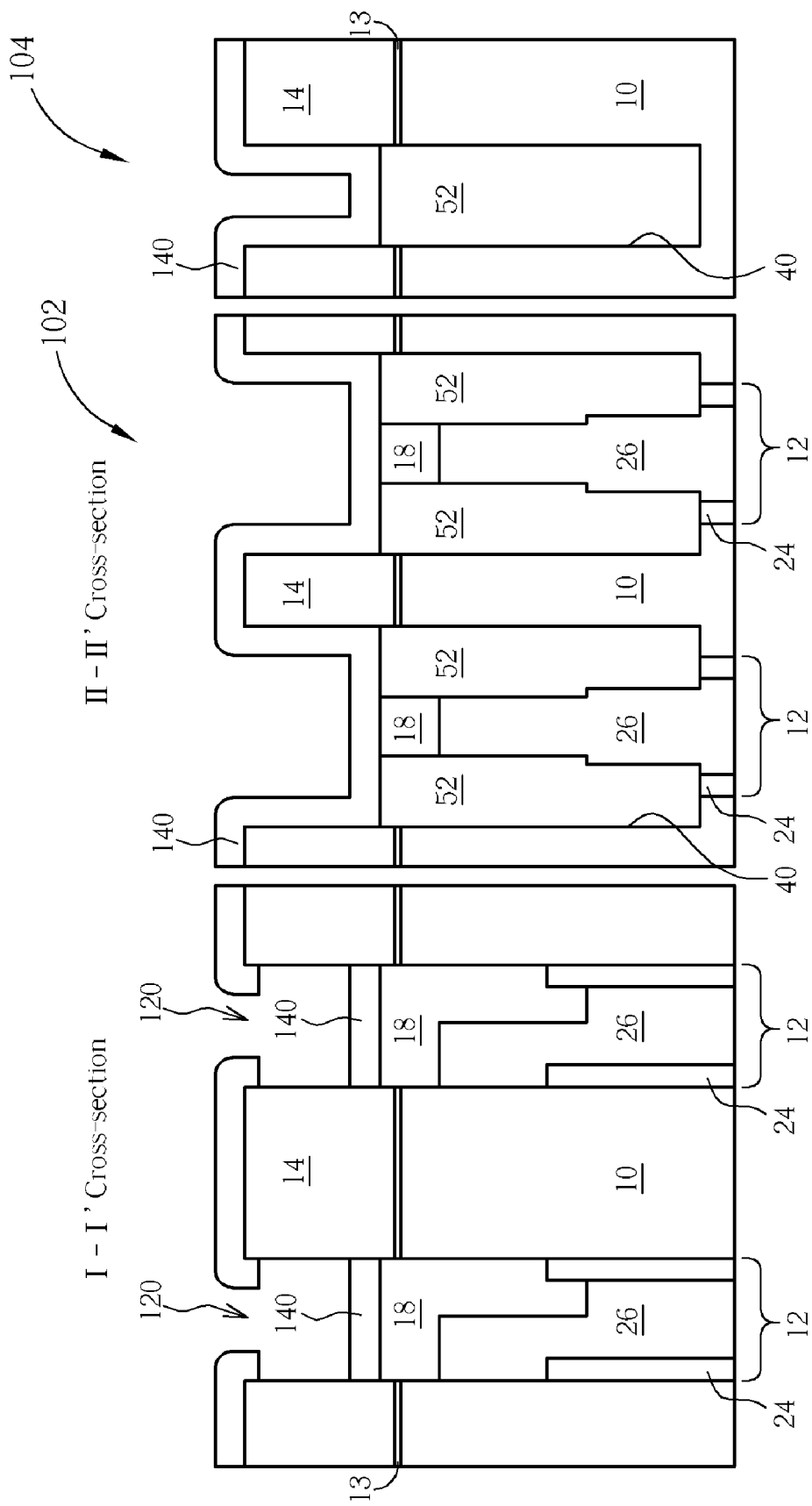

As shown in FIG. 17, the photoresist layer 130 is removed and a thermal oxidation process is performed to oxidize the remnant amorphous silicon layer 126 to a silicon oxide layer 140 with a thickness of about 200 angstroms.

Figure 18:
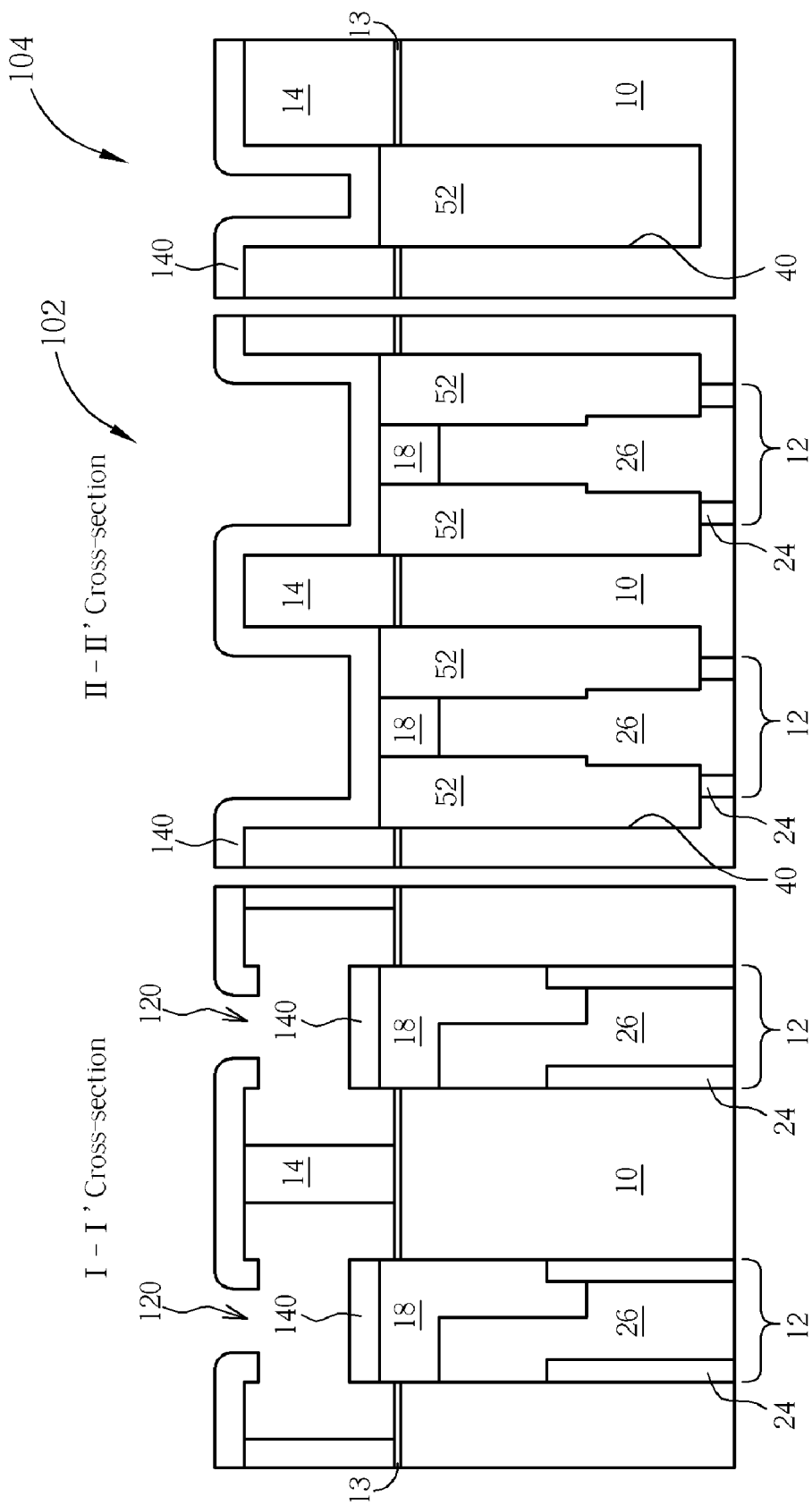

As shown in FIG. 18, a wet etching process involving the use of hot phosphoric acid solution is performed to laterally etch the pad silicon nitride layer 14 that is not covered by the silicon oxide layer 140.

According to the preferred embodiment of the present invention, the lateral etching distance of the pad silicon nitride layer 14 is about 530 angstroms, and the pad silicon nitride layer 14 of about 500 angstroms is left. The remnant pad silicon nitride layer 14 defines the position of the gate trench.

Figure 19:
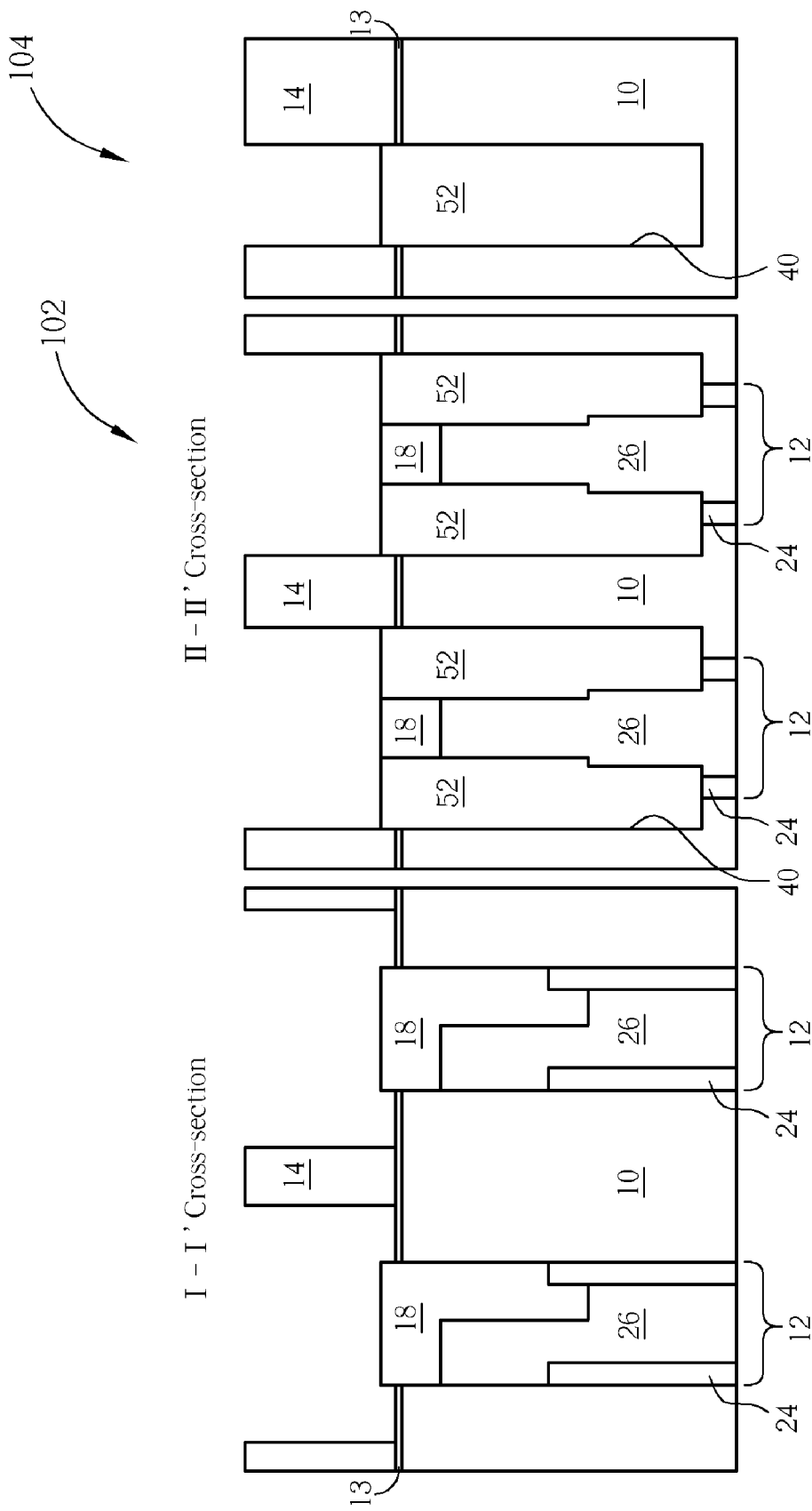

As shown in FIG. 19, the silicon oxide layer 140 is removed after the pad silicon nitride layer 14 is etched.

Figure 20:
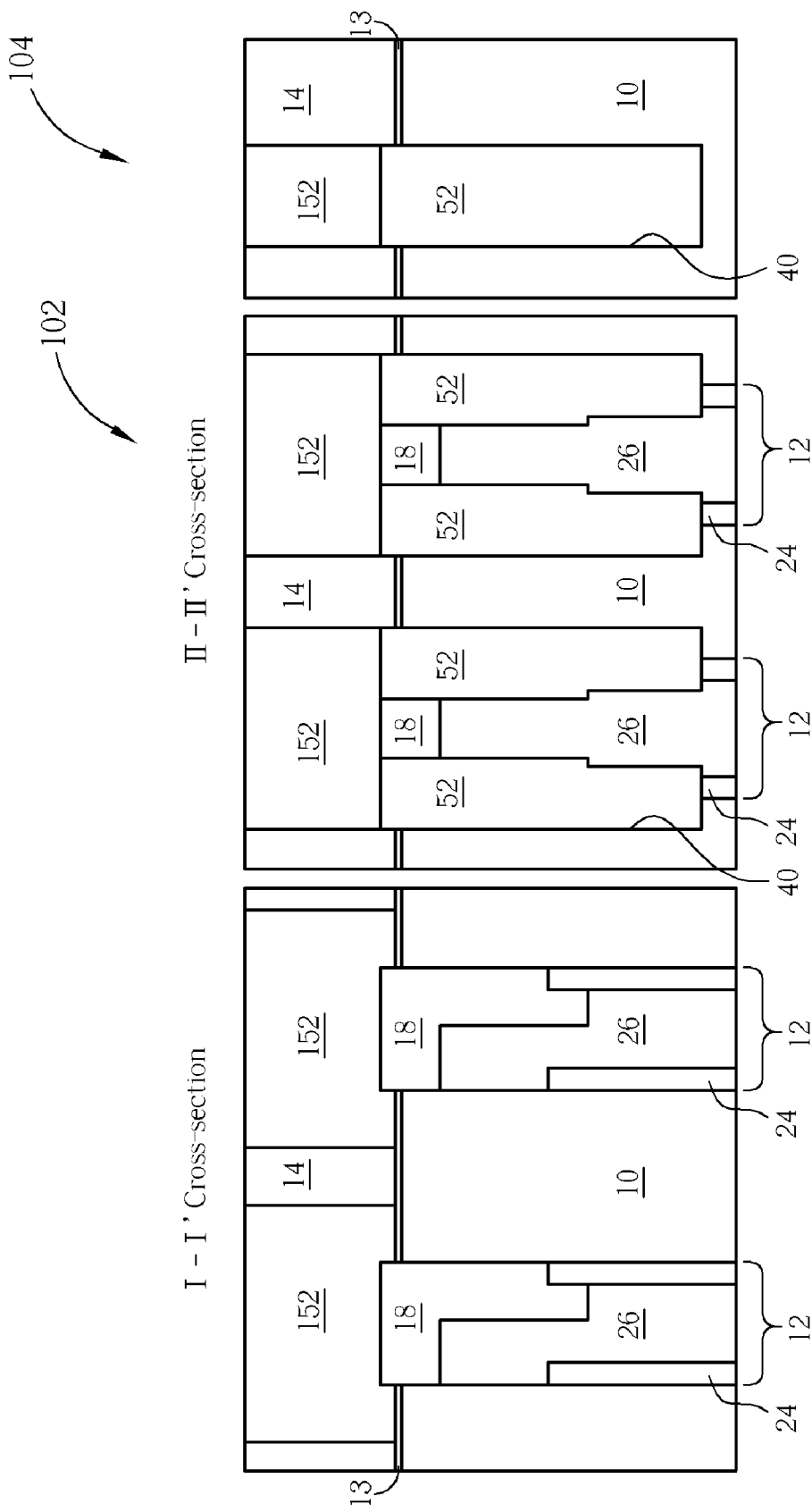

As shown in FIG. 20, a CVD process such as a LPCVD, HDPCVD process, or PECVD is carried out to deposit a silicon oxide layer 152 on the semiconductor substrate 10, and a CMP process is performed to polish the silicon oxide layer 152 to expose the pad silicon nitride layer 14.

Figure 21:
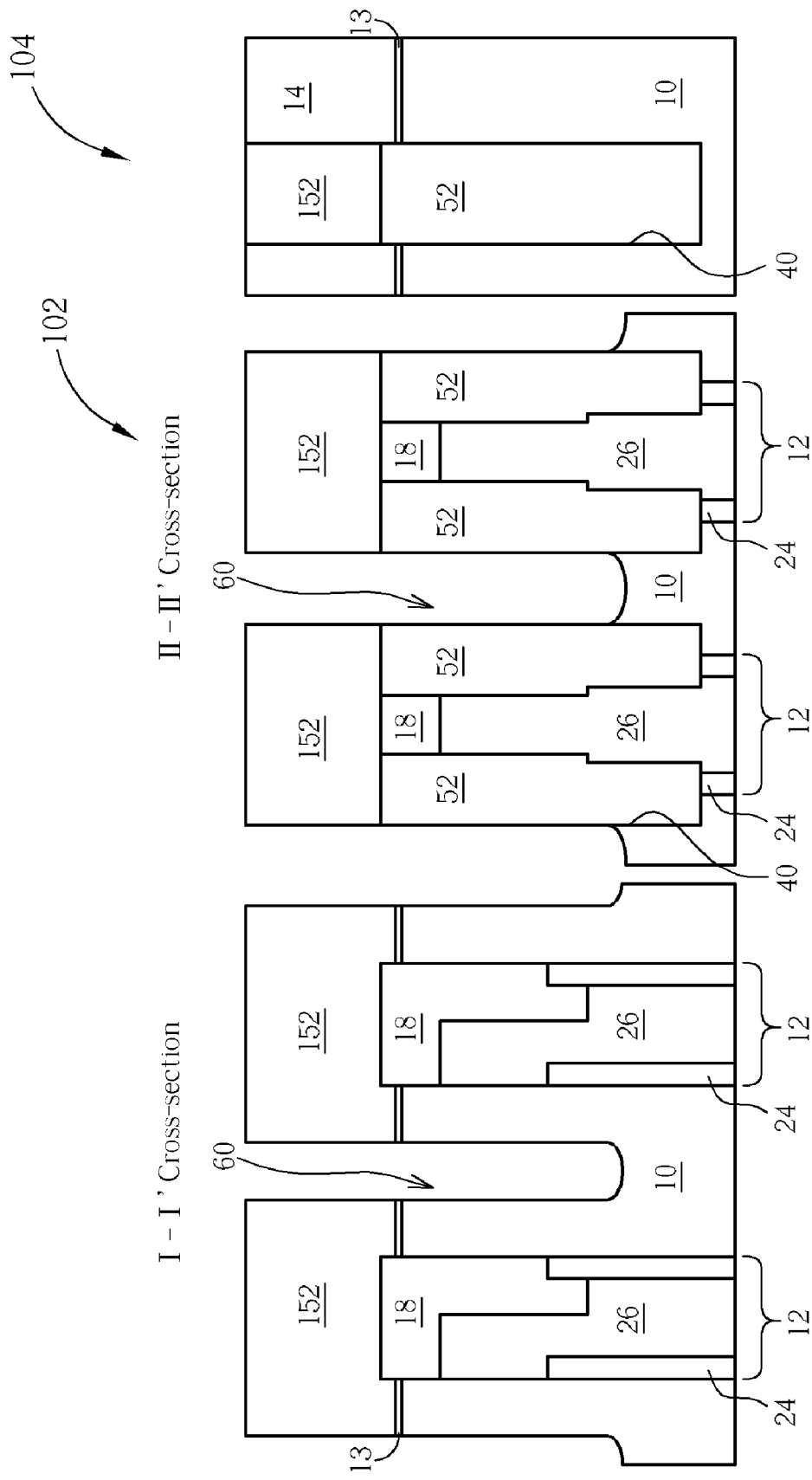

As shown in FIG. 21, an etching process is carried out to remove the pad silicon nitride layer 14 in the memory array area 102 to form an opening 54 in the silicon oxide layer 152, and then an anisotropic etching process is carried out, using the silicon oxide layer 152 as a etching mask, to etch the pad oxide layer 13 and the semiconductor substrate 10 to form a self-aligned gate trench 60.

According to the preferred embodiment of the present invention, when removing the pad silicon nitride layer 14 in the memory array area 102, the support circuit area 104 is protected using a photoresist layer (not shown), and the photoresist layer is removed after removing the pad silicon nitride layer 14 in the memory array area 102.

Figure 22:
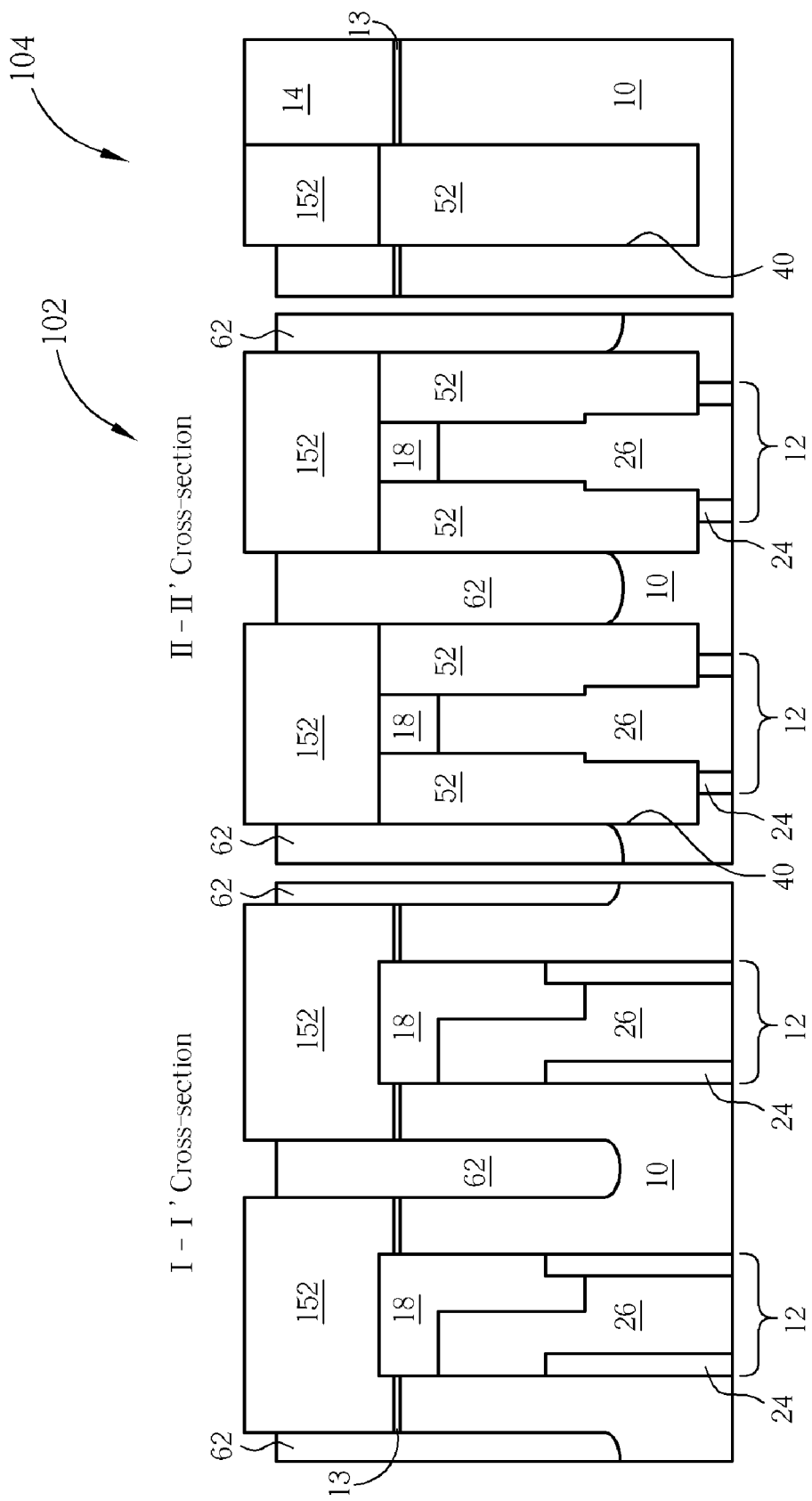

As shown in FIG. 22, a photoresist layer 62 is formed on the semiconductor substrate 10 to fill the gate trenches 60, and the photoresist layer 62 is dry cured or hardened. Then, a dry etching process is performed to etch back the photoresist layer 62 to expose the silicon oxide layer 152 and make the top surface of the photoresist layer 62 lower than the top surface of the silicon oxide layer 152.

Figure 23:
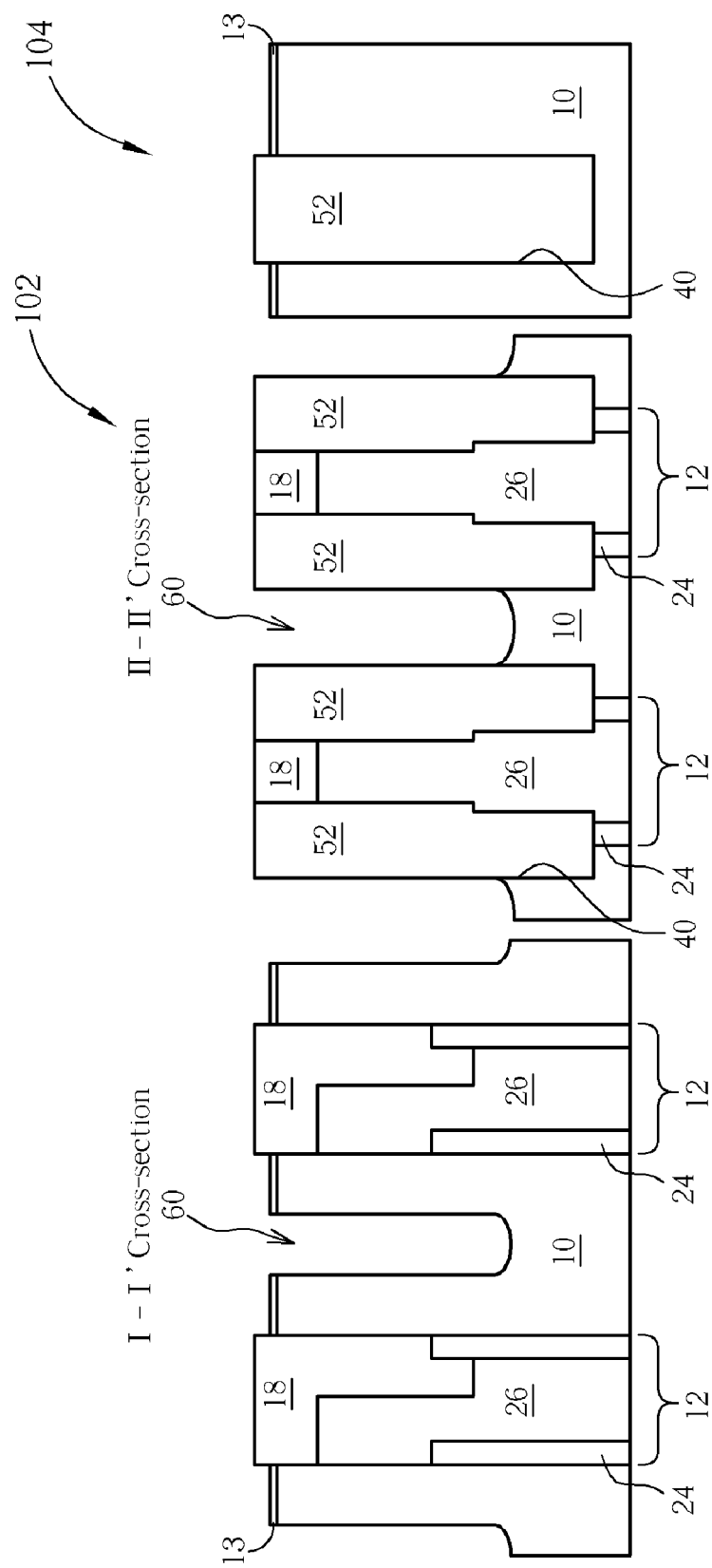

As shown in FIG. 23, an etching process such as a wet etching process or dry etching process is carried out to remove a predetermined thickness of the silicon oxide layer 152, and then another etching process such as a wet etching process is carried out to remove the pad silicon nitride layer 14 in the support circuit area 104. Then, the photoresist layer 62 is removed.

Figure 24:
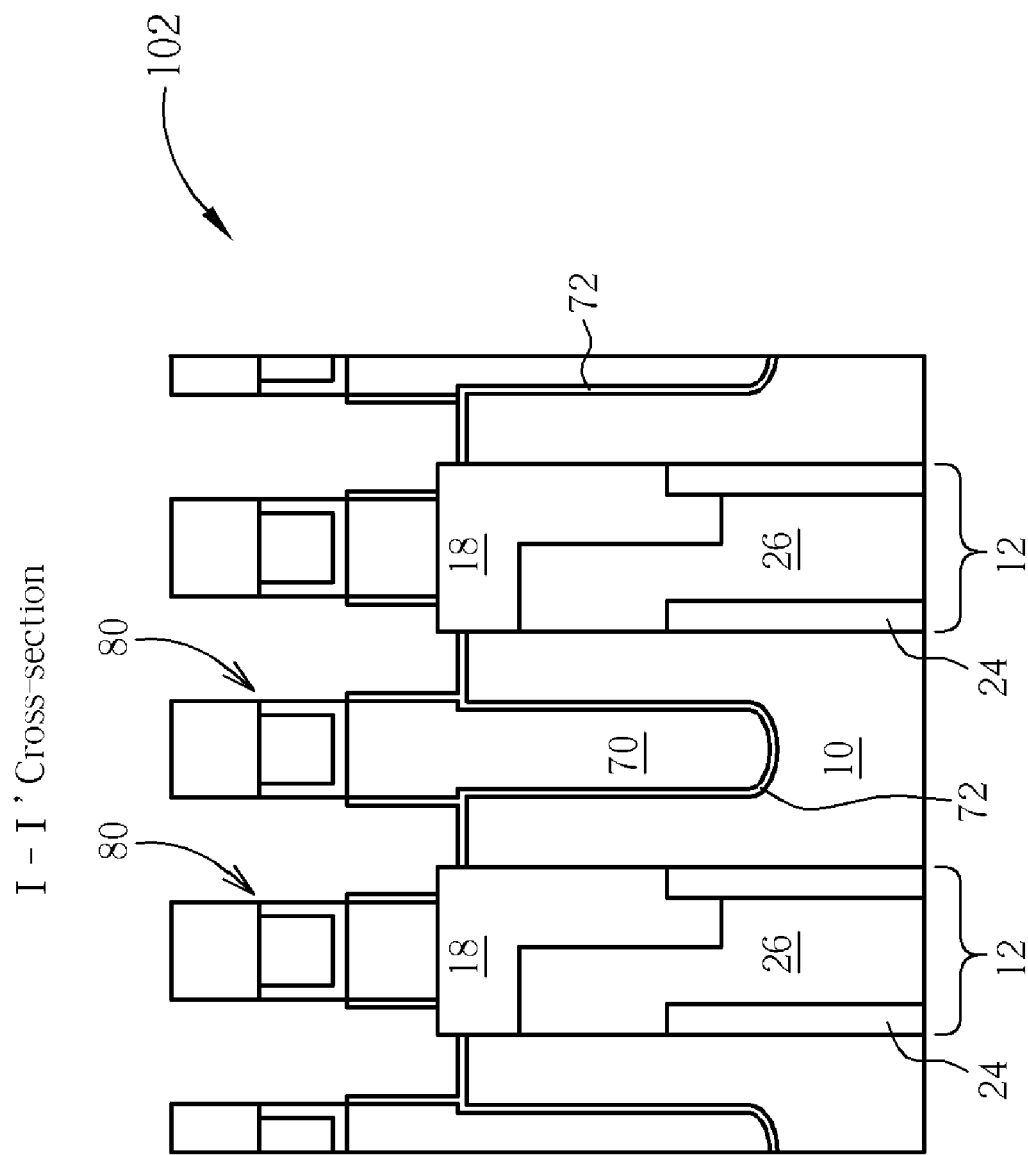

As shown in FIG. 24, a thermal oxidation process is performed to form a gate dielectric layer 72 on the exposed semiconductor substrate 10 and on the surface of the gate trench 60. The aforesaid thermal oxidation process may be In-Situ Steam Growth (ISSG) process, but not limited thereto.

Then, a trench gate 70 and a gate conductor 80 are formed on the semiconductor substrate 10 and the gate trench 60, wherein the trench gate 70 and the gate conductor 80 are defined at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a recessed gate trench, comprising:
   forming a pad layer on a semiconductor substrate;
   forming a plurality of trench capacitors in the semiconductor substrate, wherein each trench capacitor is capped with a trench top layer;
   etching back the pad layer;
   forming a cap material layer on the semiconductor substrate;
   removing the cap material layer until the trench top layer is exposed to form the cap layer on the top surface of the pad layer;
   removing the trench top layer to expose a sidewall of the pad layer;
   laterally removing a portion of the exposed sidewall of the pad layer to define a residual pad layer;
   completely removing the cap layer;
   forming an oxide layer cover the semiconductor substrate;
   removing a portion of the oxide layer to expose the residual pad layer;
   removing the residual pad layer to form an opening in the oxide layer; and
   etching the recessed gate trench into the semiconductor substrate via the opening.

2. The method of claim 1, wherein the cap layer comprises a polysilicon layer.

3. The method of claim 1, wherein the pad layer comprises a pad silicon nitride layer.

4. A method for fabricating a recessed gate trench, comprising:
   forming a pad layer on a semiconductor substrate;
   forming a plurality of trench capacitors in the semiconductor substrate, wherein the plurality of trench capacitors are located in the pad layer and the substrate;
   forming a cap layer on the pad layer, each of the plurality of trench capacitors having a trench top layer, wherein the pad layer and the cap layer are sandwiched between two adjacent trench top layers;
   forming a residual pad layer on the semiconductor substrate free of overlapping each of the plurality of trench capacitors;
   forming an oxide layer to cover the semiconductor substrate while exposing the pad layer; and
   using the oxide layer to remove the pad layer and a part of the semiconductor substrate underlying the pad layer to form the recessed gate trench.

5. The method of claim 4 further comprising:
   removing each trench top layer for partially removing the pad layer so as to define the residual pad layer on the semiconductor substrate free of overlapping each of the plurality of trench capacitors.

6. The method of claim 4 further comprising:
   forming a pad layer on the semiconductor substrate free of overlapping each of the plurality of trench capacitors;

forming a cap layer on the pad layer and on each of the plurality of trench capacitors for partially removing the pad layer to define the residual layer.

7. The method of claim 4, wherein each of the plurality of trench capacitors comprises a trench top layer underlying the oxide layer.

8. A method for fabricating a recessed gate trench, comprising:

forming a pad layer on a semiconductor substrate;

forming a plurality of trench capacitors in the semiconductor substrate, wherein each trench capacitor is capped with a trench top layer;

removing the trench top layer to expose the sidewall of the pad layer;

forming an layer to cover the sidewall and the top surface of the pad layer;

performing a tilt-angle ion implantation process to implant dopants into a portion of the layer;

removing the layer un-implanted with the dopants to form the cap layer on the top surface of the pad layer and expose the sidewall of the pad layer laterally removing a portion of the exposed sidewall of the pad layer to define a residual pad layer;

completely removing the cap layer;

forming an oxide layer cover the semiconductor substrate;

removing a portion of the oxide layer to expose the residual pad layer;

removing the residual pad layer to form an opening in the oxide layer; and etching the recessed gate trench into the semiconductor substrate via the opening.

9. The method of claim 8 further comprising performing a thermal oxidation process to oxidize the silicon layer implanted with the dopants to a silicon oxide layer.

10. The method of claim 9, wherein the silicon layer comprises an amorphous silicon layer.

* * * * *